United States Patent
Fanning et al.

(10) Patent No.: US 9,430,151 B2
(45) Date of Patent: Aug. 30, 2016

(54) MULTI-LEVEL MEMORY WITH DIRECT ACCESS

(71) Applicant: Intel Corporation, Santa Clara, CA (US)

(72) Inventors: Blaise Fanning, Folsom, CA (US); Shekoufeh Qawami, El Dorado Hills, CA (US); Raymond S. Tetrick, Portland, OR (US); Frank T. Hady, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/879,004

(22) Filed: Oct. 8, 2015

(65) Prior Publication Data

US 2016/0110106 A1 Apr. 21, 2016

Related U.S. Application Data

(63) Continuation of application No. 13/993,695, filed as application No. PCT/US2011/067824 on Dec. 29, 2011, now Pat. No. 9,190,124.

(51) Int. Cl.
*G06F 12/00* (2006.01)
*G06F 3/06* (2006.01)
(Continued)

(52) U.S. Cl.
CPC ............ *G06F 3/0604* (2013.01); *G06F 3/0631* (2013.01); *G06F 3/0644* (2013.01); *G06F 3/0688* (2013.01); *G06F 12/023* (2013.01); *G06F 12/0238* (2013.01); *G06F 12/08* (2013.01); *G06F 12/10* (2013.01); *G11C 7/1006* (2013.01); *G11C 16/00* (2013.01);

(Continued)

(58) Field of Classification Search
CPC .. G06F 12/0238; G06F 12/023; G06F 12/08; G06F 12/10; G06F 12/1009; G06F 3/0604; G06F 3/0631; G06F 3/0644; G06F 3/0688
See application file for complete search history.

(56) References Cited

U.S. PATENT DOCUMENTS 5,963,983 A 10/1999 Sakakura et al.
8,195,891 B2 6/2012 Trika
(Continued)

FOREIGN PATENT DOCUMENTS

CN 1773692 A 5/2006
CN 101923499 A 12/2010
(Continued)

OTHER PUBLICATIONS

Office Action received for Korean patent Application No. 10-2014-7016262, mailed Oct. 1, 2015, 8 pages including 2 pages English translation.

(Continued)

*Primary Examiner* — Shawn X Gu
(74) *Attorney, Agent, or Firm* — Alpine Technology Law Group LLC

(57) ABSTRACT

Examples of a multi-level memory with direct access are described. Examples include designating an amount of a non-volatile random access memory (NVRAM) for use as memory for a computer system. Examples also include designating a second amount of the NVRAM to for use as storage for the computing device. Examples also include re-designating at least a first portion of the first amount of NVRAM from use as memory to use as storage.

26 Claims, 14 Drawing Sheets

(51) Int. Cl.
*G06F 12/02* (2006.01)
*G06F 12/10* (2016.01)
*G11C 16/00* (2006.01)
*G11C 7/10* (2006.01)
*G06F 12/08* (2016.01)
*G11C 11/56* (2006.01)

(52) U.S. Cl.
CPC . *G06F2212/205* (2013.01); *G06F 2212/2024* (2013.01); *G06F 2212/7201* (2013.01); *G06F 2212/7204* (2013.01); *G11C 11/56* (2013.01); *Y02B 60/1225* (2013.01)

(56) References Cited

U.S. PATENT DOCUMENTS

| 2005/0144419 | A1 | 6/2005 | Hong et al. |
| 2006/0099743 | A1 | 5/2006 | Lung |
| 2010/0250833 | A1 | 9/2010 | Trika |
| 2011/0153908 | A1 | 6/2011 | Schaefer et al. |
| 2011/0246597 | A1 | 10/2011 | Swanson et al. |
| 2013/0024602 | A1* | 1/2013 | Sauber ............... G06F 3/0607 711/103 |

FOREIGN PATENT DOCUMENTS

| TW | 201110124 A | 3/2011 |
| TW | 201122812 A | 7/2011 |

OTHER PUBLICATIONS

Office Action received for German Patent Application No. DE112011106078.5, mailed Nov. 2, 2015, 14 pages (untranslated).

Office Action and Search Report received for Chinese Patent Application No. 201180075995.2, mailed Dec. 28, 2015, 12 pages including 7 pages English translation.

Office Action received for Chinese Patent Application No. 201180075995.2, mailed on Dec. 28, 2015, 12 pages ncluding 7 pages of English translation.

Office Action Received for Taiwanese Patent Application No. 101149809 mailed on Apr. 28, 2016, 8 pages including 1 page of English translation.

* cited by examiner

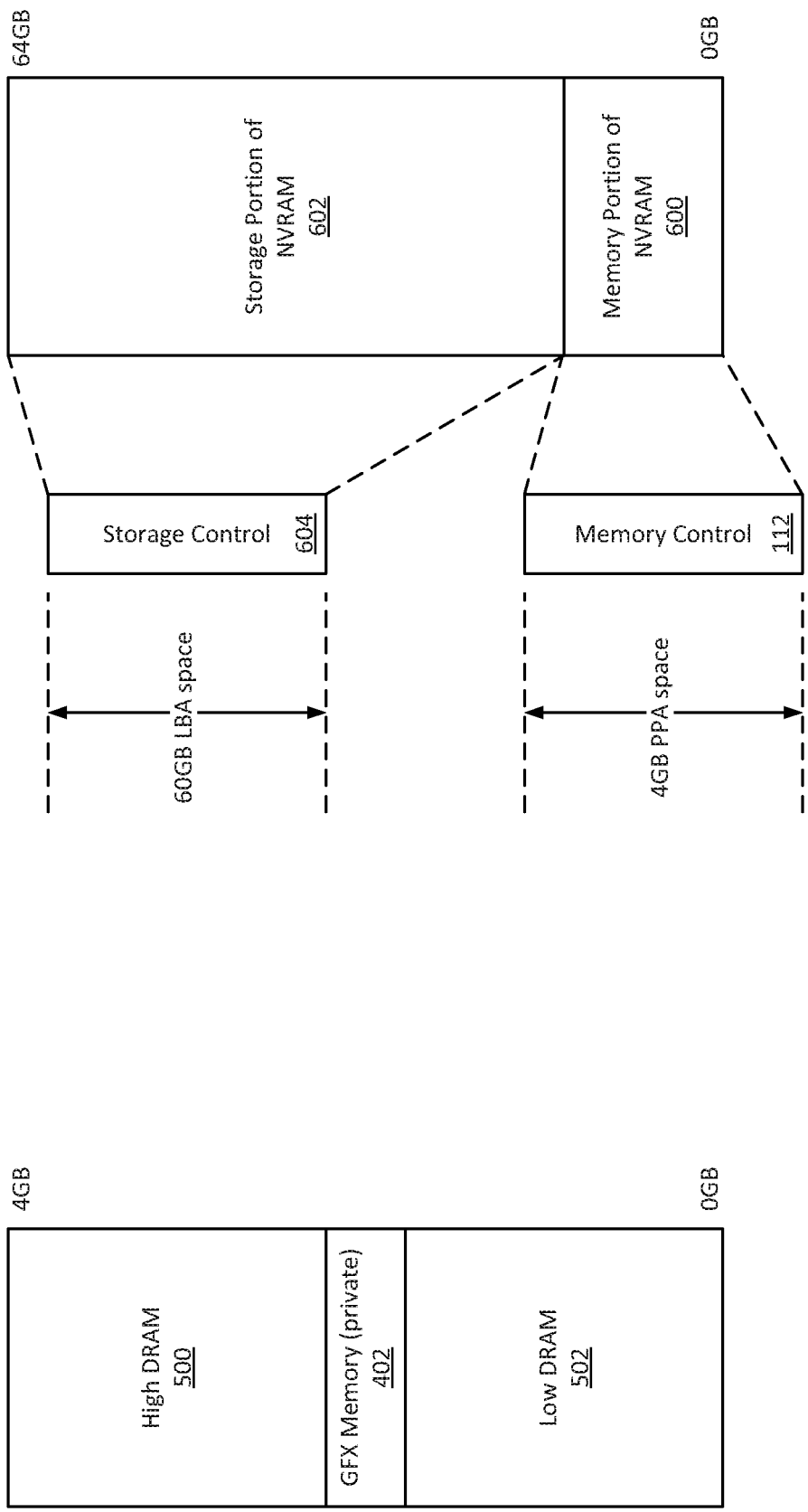

MULTI-LEVEL MEMORY WITH DIRECT ACCESS

CROSS-REFERENCE TO RELATED APPLICATIONS

This application is a continuation of, claims the benefit of and priority to previously filed U.S. patent application Ser. No. 13/993,695, now U.S. Pat. No. 9,190,124, filed Jun. 13, 2013, entitled "Multi-Level Memory With Direct Access", which in turn claims benefit of and priority to International Application Number PCT/US2011/067824, filed on Dec. 29, 2011, the subject matter of which is incorporated herein by reference in its entirety.

FIELD OF THE INVENTION

The invention relates to implementing a multi-level memory subsystem with direct non-volatile access.

DESCRIPTION OF THE RELATED ART

Phase-Change Memory and Switch (PCMS) is a non-volatile storage technology under development as a successor to the NAND non-volatile storage ubiquitous in today's solid state storage devices. PCMS offers much higher performance than NAND flash and in fact begins to approach the performance points of the Dynamic Random Access Memory (DRAM) currently used as primary dynamic storage in most client computing devices. While PCMS storage may initially be more expensive per-bit than NAND storage, that relationship is forecasted to change over time until, eventually, PCMS is less expensive than NAND.

BRIEF DESCRIPTION OF THE DRAWINGS

The following description and accompanying drawings are used to illustrate embodiments of the invention. In the drawings:

FIG. 5 illustrates the lower 4 GB of physical addressable memory space for a processor.

FIG. 6 illustrates an embodiment of a dual-partitioned non-volatile random access memory that utilizes a portion for far memory and the other portion for storage.

DETAILED DESCRIPTION

Figure 1:
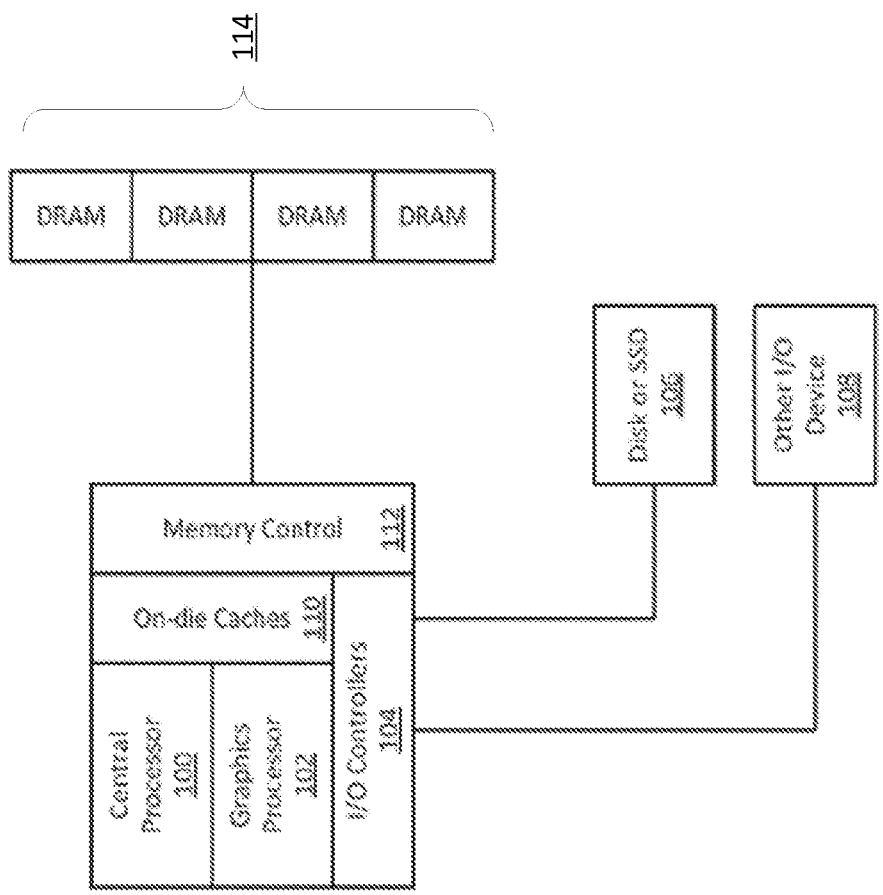
FIG. 1 illustrates an embodiment of a typical computer system.

The combination of technologies such as PCMS non-volatile storage, with the decrease in the size and the increase in performance of transistors in integrated circuits, may allow System-on-a-Chip (SoC) architectures to take advantage of the opportunity to create exciting new systems while achieving new combinations of low cost, low power, and high performance solutions. This advance is based on a revision to the existing memory hierarchy that establishes a different balance between the amounts of static random access memory (SRAM), dynamic RAM (DRAM), and non-volatile storage deployed in a low-cost smartphone, tablet, notebook, or other form of a mobile computing device. There are many types of non-volatile storage, though according to many embodiments described, non-volatile random access memory (NVRAM) storage is utilized and is described in greater detail below.

1. Non-Volatile Random Access Memory Overview

There are many possible technology choices for NVRAM, including phase change memory (PCM), Phase Change Memory and Switch (PCMS) (the latter being a more specific implementation of the former), byte-addressable persistent memory (BPRAM), storage class memory (SCM), universal memory, Ge2Sb2Te5, programmable metallization cell (PMC), resistive memory (RRAM), RESET (amorphous) cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM)), STRAM (spin tunneling RAM), magnetoresistive memory, magnetic memory, magnetic random access memory (MRAM), and Semiconductor-oxide-nitride-oxide-semiconductor (SONOS, also known as dielectric memory).

NVRAM has the following characteristics:

It maintains its content even if power is removed, similar to FLASH memory used in solid state disks (SSD), and different from SRAM and DRAM which are volatile;

it may have lower overall power consumption than volatile memories such as SRAM and DRAM;

it may have random access similar to SRAM and DRAM (also known as randomly addressable);

it is rewritable and erasable at a lower level of granularity (e.g., byte level) than FLASH found in SSDs (which can only be rewritten and erased a "block" at a time—minimally 64 Kbyte in size for NOR FLASH and 16 Kbyte for NAND FLASH);

it can be used as a system memory and allocated all or a portion of the system memory address space;

it may be capable of being coupled to the CPU over a bus (also interchangeably referred to as an interconnect or link) using a transactional protocol (a protocol that supports transaction identifiers (IDs) to distinguish different transactions so that those transactions can complete out-of-order) and allowing access at a level of granularity small enough to support operation of the NVRAM as system memory (e.g., cache line size such as 64 or 128 byte). For example, the bus/interconnect may be a memory bus (e.g., a double data rate (DDR) bus such as DDR3, DDR4, etc.) over which is run a transactional protocol as opposed to the non-transactional protocol that is normally used. As another example, the bus may run over a bus that normally runs a transactional protocol (a native transactional protocol), such as a PCI express (PCIE) bus, desktop management interface (DMI) bus, or any other type of bus utilizing a transactional protocol and a small enough transaction payload size (e.g., cache line size such as 64 or 128 byte); and it also may have one or more of the following characteristics:
  a faster write speed than non-volatile memory/storage technologies such as FLASH;
  very high read speeds (faster than FLASH and near or equivalent to DRAM read speeds);
  it can be directly writable (rather than requiring erasing (overwriting with 1s) before writing data like FLASH memory used in SSDs); and/or
  a greater number of writes before failure (more than boot ROM and FLASH used in SSDs).

As mentioned above, in contrast to FLASH memory, which must be rewritten and erased a complete "block" at a time, the level of granularity at which NVRAM is accessed in any given implementation may depend on the particular memory controller and the particular memory bus or other type of bus to which the NVRAM is coupled. For example, in some implementations where NVRAM is used as system memory, the NVRAM may be accessed at the granularity of a cache line (e.g., a 64-byte or 128-Byte cache line), notwithstanding an inherent ability to be accessed at the granularity of a byte, because cache line is the level at which the memory subsystem accesses memory. Thus, in some embodiments, when NVRAM is deployed within a memory subsystem, it may be accessed at the same level of granularity as DRAM used in the same memory subsystem. Even so, in some embodiments, the level of granularity of access to the NVRAM by the memory controller and memory bus or other type of bus is smaller than that of the block size used by Flash and the access size of the I/O subsystem's controller and bus.

NVRAM may also incorporate wear leveling algorithms to account for the fact that the storage cells begin to wear out after a number of write accesses, especially where a significant number of writes may occur such as in a system memory implementation. Since high cycle count blocks are most likely to wear out in this manner, wear leveling spreads writes across the far memory cells by swapping addresses of high cycle count blocks with low cycle count blocks. Note that most address swapping is typically transparent to application programs because it is handled by hardware, lower-level software (e.g., a low level driver or operating system), or a combination of the two.

NVRAM is distinguishable from other instruction and data memory/storage technologies in terms of its characteristics and/or its application in the memory/storage hierarchy. For example, NVRAM is different from:
  static random access memory (SRAM) which may be used for level 0 and level 1 internal processor caches dedicated to each core within a processor and lower level cache (LLC) shared by cores within a processor;
  dynamic random access memory (DRAM) configured as a cache internal to a processor die (e.g., on the same die as the processor), configured as one or more caches external to a processor die (e.g., in the same or a different package than the processor die), or general system memory external to the processor package; and
  FLASH memory/magnetic disk/optical disc applied as mass storage; and
  memory such as FLASH memory or other read only memory (ROM) applied as firmware memory (which can refer to boot ROM, basic input/output system (BIOS) Flash, and/or trusted platform module (TPM) Flash).

NVRAM may be used as instruction and data storage that is directly addressable by a processor and is able to sufficiently keep pace with the processor in contrast to FLASH/magnetic disk/optical disc applied as mass storage. Direct addressability refers to a processor, such as a CPU or GPU, being able to send memory requests to the NVRAM as if it were standard DRAM (e.g., through standard memory store and load commands). Moreover, as discussed above and described in detail below, NVRAM may be placed on a memory bus and may communicate directly with a memory controller that, in turn, communicates directly with the processor.

NVRAM may be combined with other instruction and data storage technologies (e.g., DRAM) to form hybrid memories (also known as Co-locating PCM and DRAM; first level memory and second level memory; FLAM (FLASH and DRAM)). Note that at least some of the above technologies, including PCM/PCMS may be used for mass storage instead of, or in addition to, system memory, and need not be random accessible, byte addressable or directly addressable by the processor when applied in this manner.

For convenience of explanation, most of the remainder of the application will refer to "NVRAM" or, more specifically, "PCM," or "PCMS" as the technology selection for the non-volatile memory. As such, the terms NVRAM, PCM, and PCMS may be used interchangeably in the following discussion. However it should be realized, as discussed above, that different technologies may also be utilized.

2. Multi-Level Memory Overview

Multi-Level Memory (MLM) is a revolutionary change to a PC platform topology. FIG. 1 illustrates an embodiment of a typical computer system that comprises:
  One or more central/general processors (CPUs) (100).
  One or more graphics processors (102).
  One or more IO controllers and their associated IO devices (104), such as disk or solid state drive (SSD) (106) and other input/output (I/O) device (108).
  On-die caches (110) that are meant to insulate the central processor and optionally the graphics processors from the relatively slow DRAM memory.

A memory controller (112) that is designed to schedule DRAM commands optimally for bandwidth and/or latency, depending upon the system requirements at the time.

One or more groups of DRAM storage (114), arranged typically as 64-bit channels. Low-end computing devices might have a single channel, while high-end computing devices might have two or three DRAM channels.

If a typical computing device were implemented with double data rate 3 (DDR3) components, then the latency for a memory read transaction, initiated by a processor, that misses the on-die caches, might be on the order of 30 nanoseconds (ns) from the time that the transaction was passed to the memory controller to the time that the data was returned to the on-die cache block (e.g., 15 ns for a DRAM page hit, 30 ns for a DRAM page empty, 45 ns for a DRAM page miss). This latency is often a significant driver of processor application performance.

The peak bandwidth on a single channel of DDR3-1600 memory is 12.8 gigabytes (GB) per second. The effective bandwidth of such a channel would typically be around 70% of that number. This effective memory bandwidth can play a fundamental role in the performance of general purpose processors and graphics processors.

Figure 2:
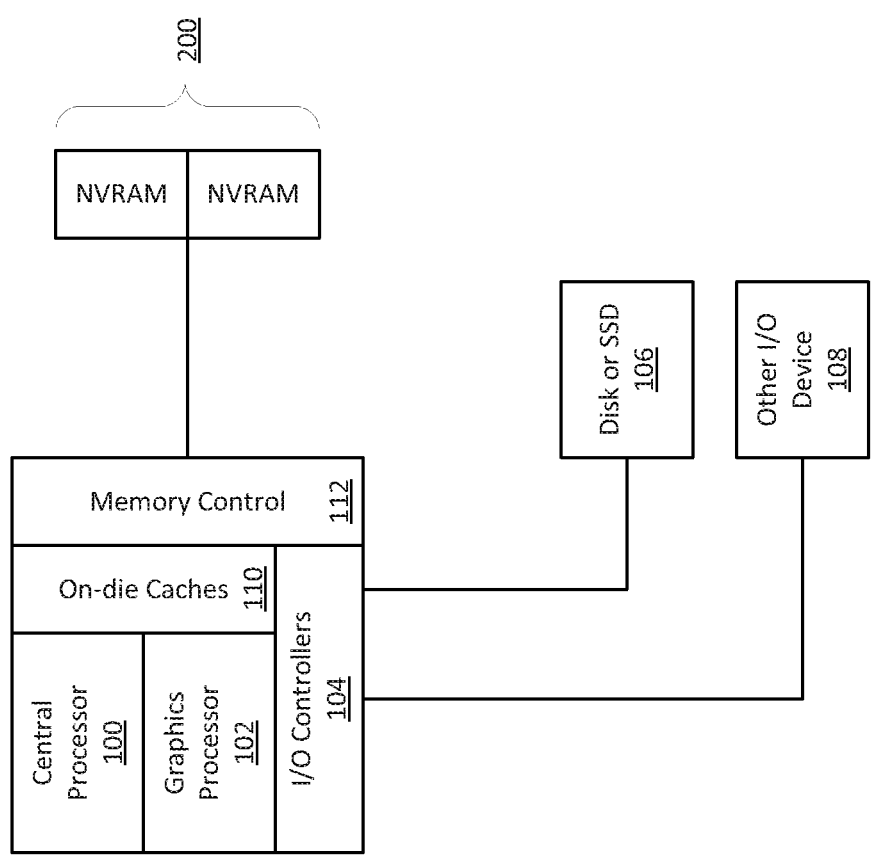
FIG. 2 illustrates an embodiment of a simple two-level memory implementation in a computer system.

In a simple form, 2-level memory can be considered a mechanism that replaces a system's bulk DDR DRAM storage with NVRAM storage (e.g., with PCMS storage), which is shown in FIG. 2 (i.e., NVRAM devices 200).

The solution shown in FIG. 2 could be implemented at low cost. However, the performance, power consumption, and reliability attributes of such a system would not be ideal and potentially could have significant issues with certain applications that would, by their nature cause adverse power, performance, or device-wear conditions. The latency (~50 ns) and bandwidth (~6.4 GB/sec for reads) of a FIG. 2-like configuration utilizing PCMS, for example, are far higher and lower, respectively, than that of the DRAM (from FIG. 1) that the PCMS devices are replacing.

Another issue specifically with PCMS that requires caution when replacing DRAM is the sharp difference between PCMS' read and write bandwidth capability. With DRAM, every memory device is capable of reading and writing data at the same rate. PCMS cores, however, by their physical nature, require a much longer time to write a piece of data than they do to read a piece of data. The read/write bandwidth ratio for PCMS is 4:1. In other words, data can be read from a PCMS device four times faster than data can be written to that device.

Taken as a whole, a computing device writes data to volatile memory (traditional DRAM) for one of three reasons:

As a temporary space used in the process of running an application or system service. There are typically two types of temporary space: a heap space that persists during the lifetime of an application and one or more stack spaces that appear and disappear in much shorter spans.

As a longer-term storage space that lasts for the duration of an application or of the operating system runtime on the system.

As a DMA buffer used to stage data before it is exchanged in some way between an I/O subsystem and a general purpose or graphics processor. This is typically used for communication between an information-processing device (the CPU or GPU) and an external entity like an end-user in the case of graphics data or the network in the case of HTML browsing data.

At least the heap space, stack space, and DMA buffers are temporary by definition. Temporary storage usages, such as these, can be held in a smaller DRAM footprint with an efficient caching that implements traditional replacement algorithms and eliminates most traffic to and from the PCMS. At the core of an MLM-based memory system is a large write-back DRAM that retains recently used data, absorbs write transactions, and allows the system substantial read-around-write capabilities. The DRAM essentially is utilized as a cache for PCMS.

Figure 3:
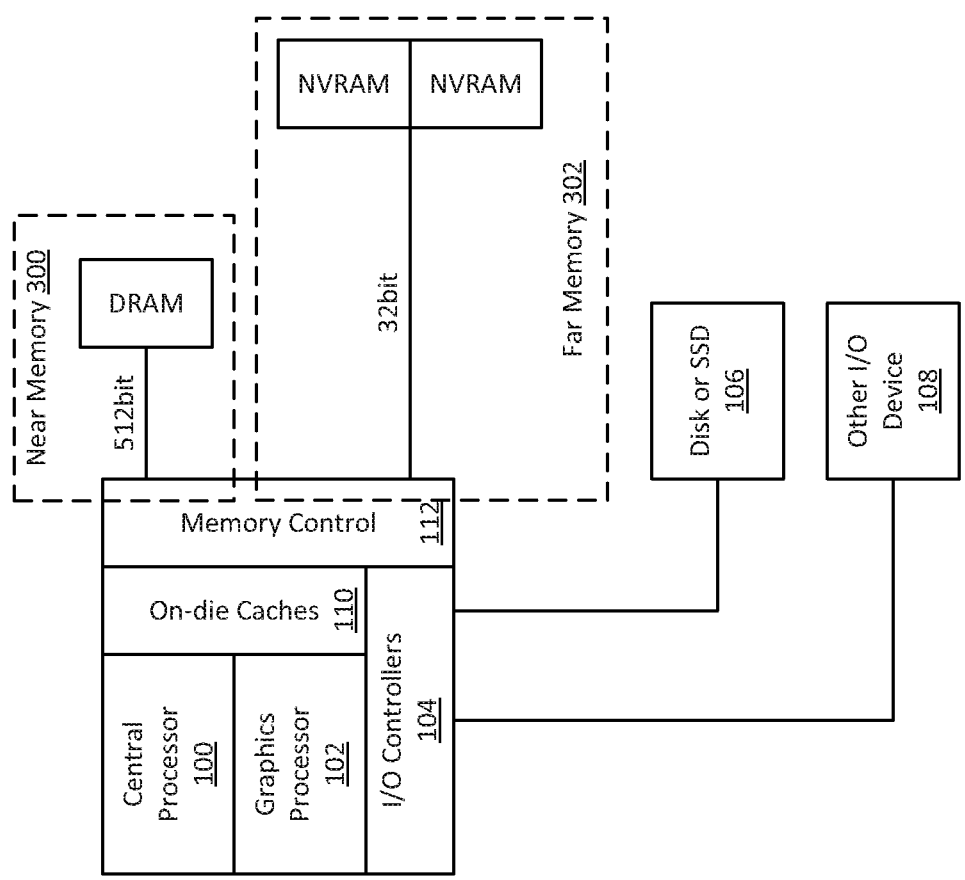
FIG. 3 illustrates an embodiment of a multi-level memory-based system with a dynamic random access memory being utilized as a cache for a non-volatile random access memory.

FIG. 3 illustrates a MLM-based system with a DRAM being utilized as a cache for a NVRAM memory. In this example, the DRAM is called "near memory" 300 and the NVRAM (e.g. PCMS) is called "far memory" 302. This nomenclature is based on relative performance of the memory (near memory generally having lower latency and higher bandwidth than far memory). Additionally, although there are many possible links (i.e., busses, interconnects) that may be utilized to attach DRAM and NVRAM, in the embodiment shown in FIG. 3, the far memory NVRAM is attached through a 32-bit wide link that comprises a single memory channel for a given amount of NVRAM (e.g., 64 GB), and the near memory DRAM is attached through a 512-bit wide link (potentially a cache line of data wide) that comprises a through-silicon via (TSV) attachment between DRAM chip and the SoC. Thus, in different embodiments, depending upon cost, performance, and power considerations associated with the computing device, the DRAM may be anywhere from 64 MB to 512 MB or more. The effectiveness of MLM is dominated by the amount of time that a given workload or set of workloads "hits" the near memory cache, in light of the performance characteristics of a near memory hit and the penalty incurred for a far memory transaction.

Figure 4:
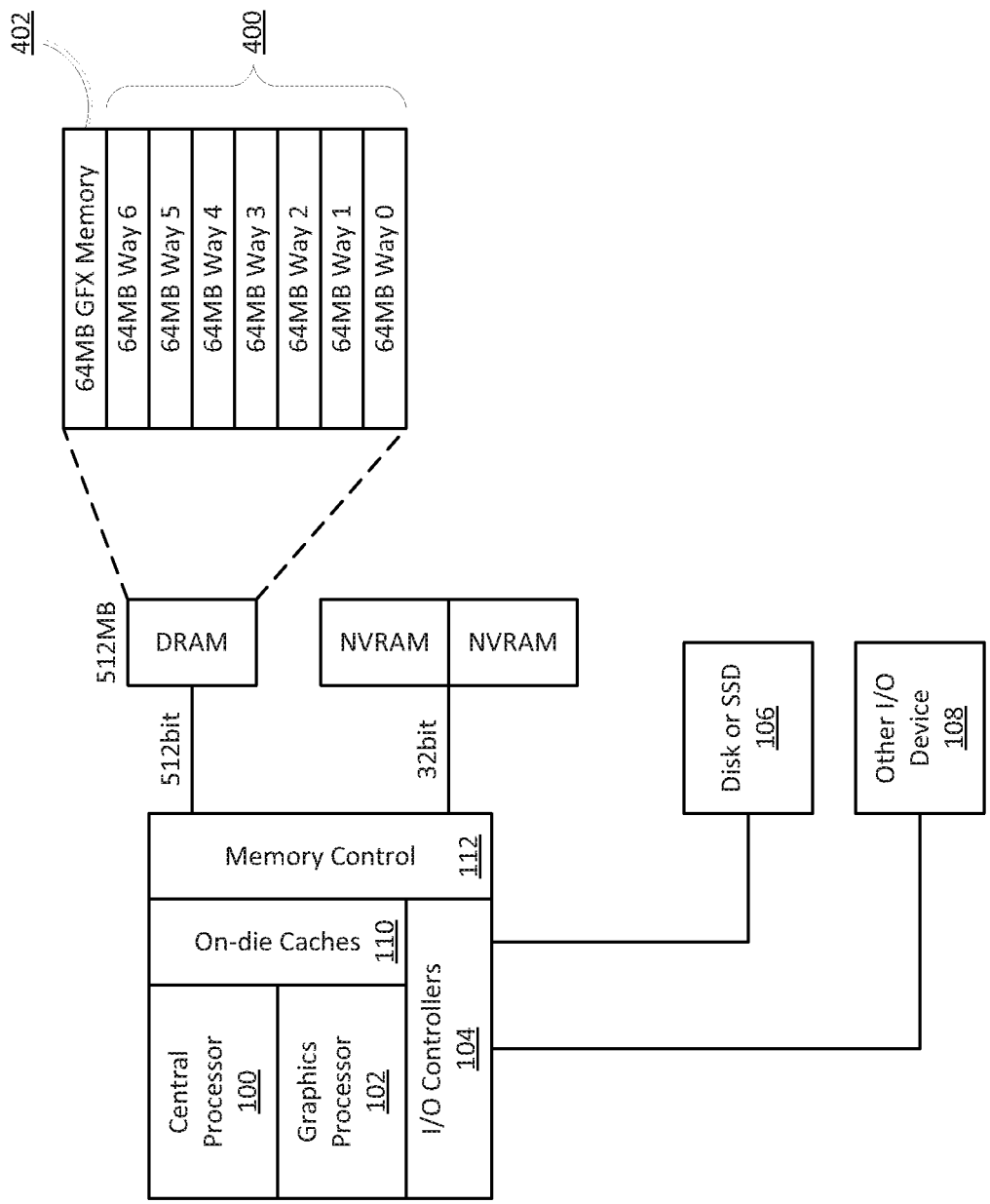
FIG. 4 illustrates an embodiment of a multi-level memory-based system that accounts for specialized usage of a portion of the dynamic random access memory cache.

A cache that is unnecessarily blind to the characteristics of the data that it contains is often simplest to implement, but can be sub-optimal. For that reason, the MLM architecture comprehends that it may be better to allocate dedicated regions of the near memory for specific uses. FIG. 4 illustrates a MLM-based system that accounts for specialized usage of a portion of the DRAM cache. In FIG. 4, the 512 MB DRAM space, instead of being managed as an eight-way cache with eight 64 MB ways, is divided in such a way that it is used as a 448 MB 7-way cache (400) with 64 MB dedicated for direct use by graphics hardware and drivers (402).

FIG. 5 illustrates the case where the lower 4 GB of the NVRAM has been mapped as far memory that is directly accessible by a general purpose or graphics processor. In FIG. 4, the private GFX memory area 402 would be mapped directly into the processor's physical address space, potentially between a high DRAM space 500 and a low DRAM space 502. In many embodiments, a register or a BIOS-based mechanism would be used to communicate the location to the graphics driver on boot. After that, it would be up to the graphics driver and controller to allocate drawing surfaces either into the normal physical address space or into the private GFX memory area 402 in such a way that volatile and time-sensitive surfaces (e.g., frame buffers) are contained in the private memory. Other non-volatile, non-time-sensitive surfaces, such as static textures, and other non-displayable graphics surfaces may be placed in either space, according to performance or power implications that can be deduced by the driver.

3. Multi-Level Memory with Direct Access (MLMD)

MLMD is a solution that retains the ability to run productivity, entertainment, and gaming applications under off-the-shelf Microsoft® Windows® and Linux operating systems at the same time that it removes external DRAM from the system in favor of new forms of non-volatile storage combined with embedded SRAM or DRAM devices.

In a handheld device or tablet, non-volatile storage will almost always be implemented using solid state devices like NAND or NVRAM, such as PCMS. When a device implements a MLM using NVRAM devices, it is natural to implement the entire storage system with NVRAM and it is desirable of course for the far memory and the storage system to share the NVRAM devices. FIG. 6 illustrates a dual-partitioned NVRAM that utilizes a portion for far memory 600 and the other portion for storage 602. The memory portion is indexed using a "platform-physical address" (PPA) and storage is indexed using a "logical block address" (LBA). As shown in FIG. 6, the memory control (ler)/logic 112 maps PPA space page addresses into the memory portion of the NVRAM 600 and a storage control (ler)/logic 604 maps LBA space block addresses into the storage portion of the NVRAM 602. There are issues in having this simple of a mapping. Some types of NVRAM devices, such as PCMS, have certain defect and wear characteristics that discourage direct mapping of continuous addresses between the PPA/LBA abstractions and the physical devices.

For PCMS specifically, the most visible issues include:

Defect Management—PCMS components will ship from the factory with known defects and may grow defects over their operating lifespan.

Write Wear Management—PCMS implementations have a limitation as to the number of times any given cell should be written to.

Read Disturb—PCMS implementations have a limitation as to the number of times any given cell should be read from between each write to the cell.

Figure 7:
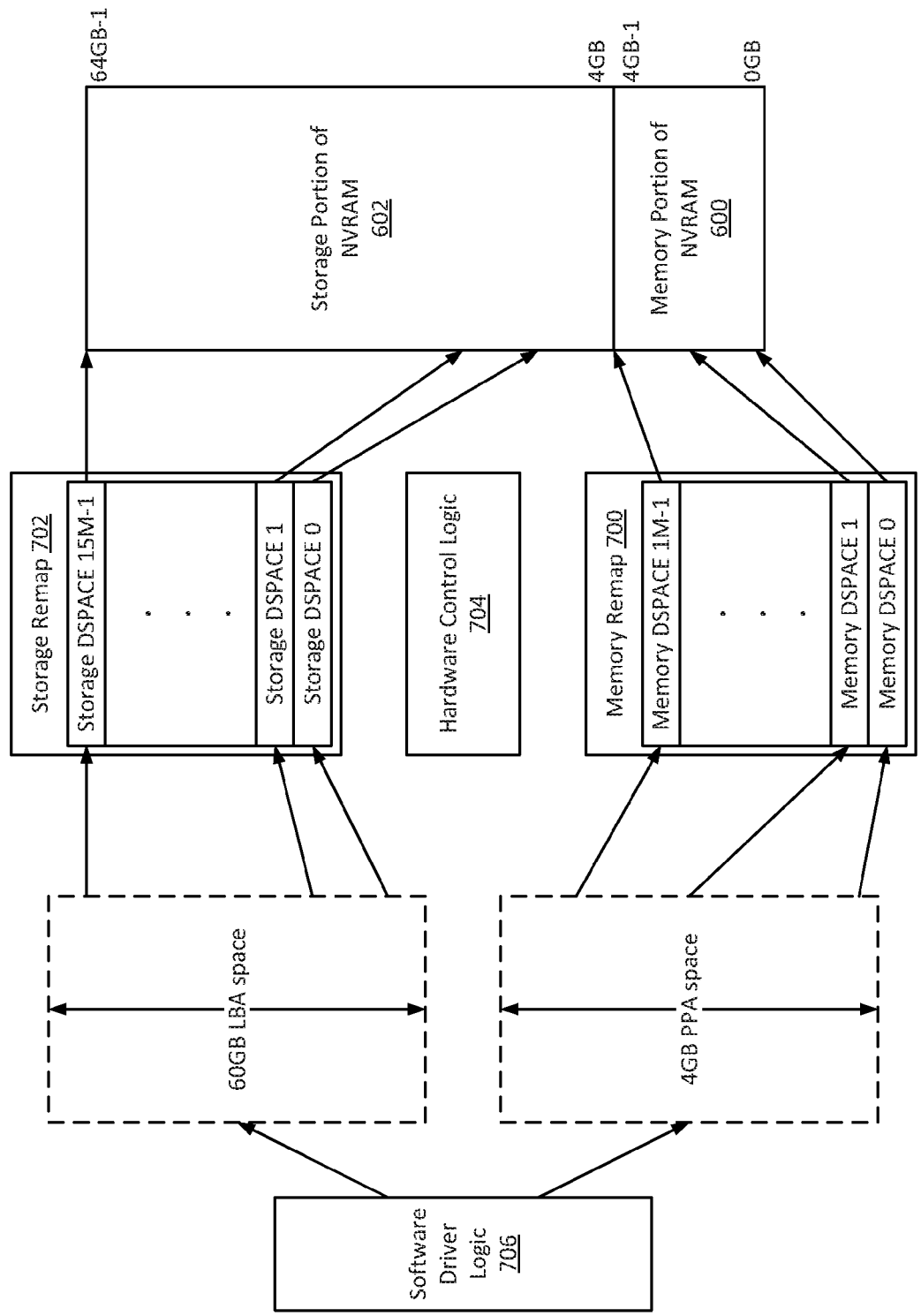
FIG. 7 illustrates an embodiment of address redirection tables that provide functionality for mapping page-granular platform physical addresses and logical block addresses into ever-changing pages in the physical non-volatile random access memory devices.

FIG. 7 illustrates address redirection tables that provide functionality for mapping page-granular PPAs and LBAs into ever-changing pages in the physical NVRAM devices. In FIG. 7, there is a "phantom" memory remap table 700 that remaps a given PPA page address to a direct address space (DSPACE) address (an address referring to a specific physical page of NVRAM) between 0 GB to 4 GB-1. The memory remap table 700, in many embodiments, is stored as a single block of memory either in an SRAM integrated into the memory control (112 in FIG. 6) or in the near memory (DRAM). As shown, there are 1 million memory DSPACE entries in the memory remap table 700 since each entry refers to a unique 4 KB page of PPA address space. The memory remap table 700 is built from groups of remap descriptors (e.g., memory DSPACE 1 represented a stored descriptor in the memory remap table 700. In many embodiments, there is one descriptor for each cacheline (e.g., 4K cacheline) of PPA space. The contents of a descriptor may vary based on different pieces of information that may need to be tracked. At least the NVRAM device address would be common to each descriptor embodiment, which would comprise a certain set of address bits in NVRAM device space corresponding to the PPA memory entry. This address would need to be in each descriptor to allow for the actual remapping procedure to take place.

Similarly to the memory descriptors, there are also storage descriptors in the storage remap table. In the embodiment shown in FIG. 7, there are 15 million storage DSPACE entries in the storage remap table 702 since each entry refers to a unique 4 KB page of LBA address space. According to some embodiments, the remap tables 700 and 702 are located within an SRAM or other high-speed memory storage structure integrated within hardware control logic 704. Although FIG. 7 shows a specific implementation of the storage and memory remap tables being a given size and organized in a given way, in many other embodiments, the storage and memory remap tables are different sizes, different levels of granularity, and/or implemented in different ways (e.g., the storage descriptors may access NVRAM in a coarser manner, wherein one descriptor refers to a 32 KB block instead of at a 4 KB page granularity, among other alternative examples). Hardware control logic 704 may represent memory control 112 or storage control 604, which are both shown in FIG. 6, or it may comprise a new and different form of control logic also designed to take advantage of the remap tables 700 and 702. In some embodiments, the storage control and memory control are represented as different control logic blocks integrated in or discrete from the processor. In other embodiments, these different forms of control logic are integrated into a single control logic block that encompasses all hardware control logic necessary to manage the NVRAM device(s).

Returning to remap tables 700 and 702, in other embodiments, these tables are stored in a reserved portion of DRAM that stores MLMD and other control data structures.

Essentially, FIG. 7 illustrates a virtual memory system that is comprised of the following components:

A memory remapping table 700 that creates a virtual or "phantom" space that emulates the traditional DRAM through a combination of a tiny amount of DRAM and an array of pointers into a physical memory portion of NVRAM space 600.

A storage remapping table 702 that provides a translation from LBA address space to a physical storage portion of NVRAM space 602.

Hardware control logic 704, that allows software driver logic 706 to manipulate pointers in the memory remapping table 700 as well as pointers in the storage remapping table.

A software driver that uses the aforementioned hardware control logic 704 to remap pointers between storage and memory portions of NVRAM instead of scheduling hardware-driven copies of data through interrupt requests and DMA transfers.

In some embodiments, there are separate software drivers utilized for manipulating the memory and storage portions of the remapping system. In other embodiments, there is one software driver that includes logic, such as software driver logic 706, that handles both remap tables. According to some embodiments, memory descriptors may be handled in hardware while storage descriptors are handled by a software driver.

Although FIG. 7 shows an embodiment of an NVRAM memory/storage system that separates NVRAM into a memory portion 600 and a storage portion 602, there is no specific reason to divide the NVRAM devices into storage and memory regions, so long as the complexity of mixing the two can be managed in a straightforward manner.

Once storage and memory have been located in the same physical device and their addresses intermingled, it becomes unnecessary to perform disk-related DMA operations in a traditional way—specifically it becomes unclear that data should be copied from one part of the NVRAM into another part. Instead, the data might simply be referenced in-place by modifying pointers in the remap tables 700 and 702. In this way, applications see that data appears in their address spaces without first having been copied there. This remapping capability is called "direct access" and accounts for the "D" in an MLMD system.

Figure 8:
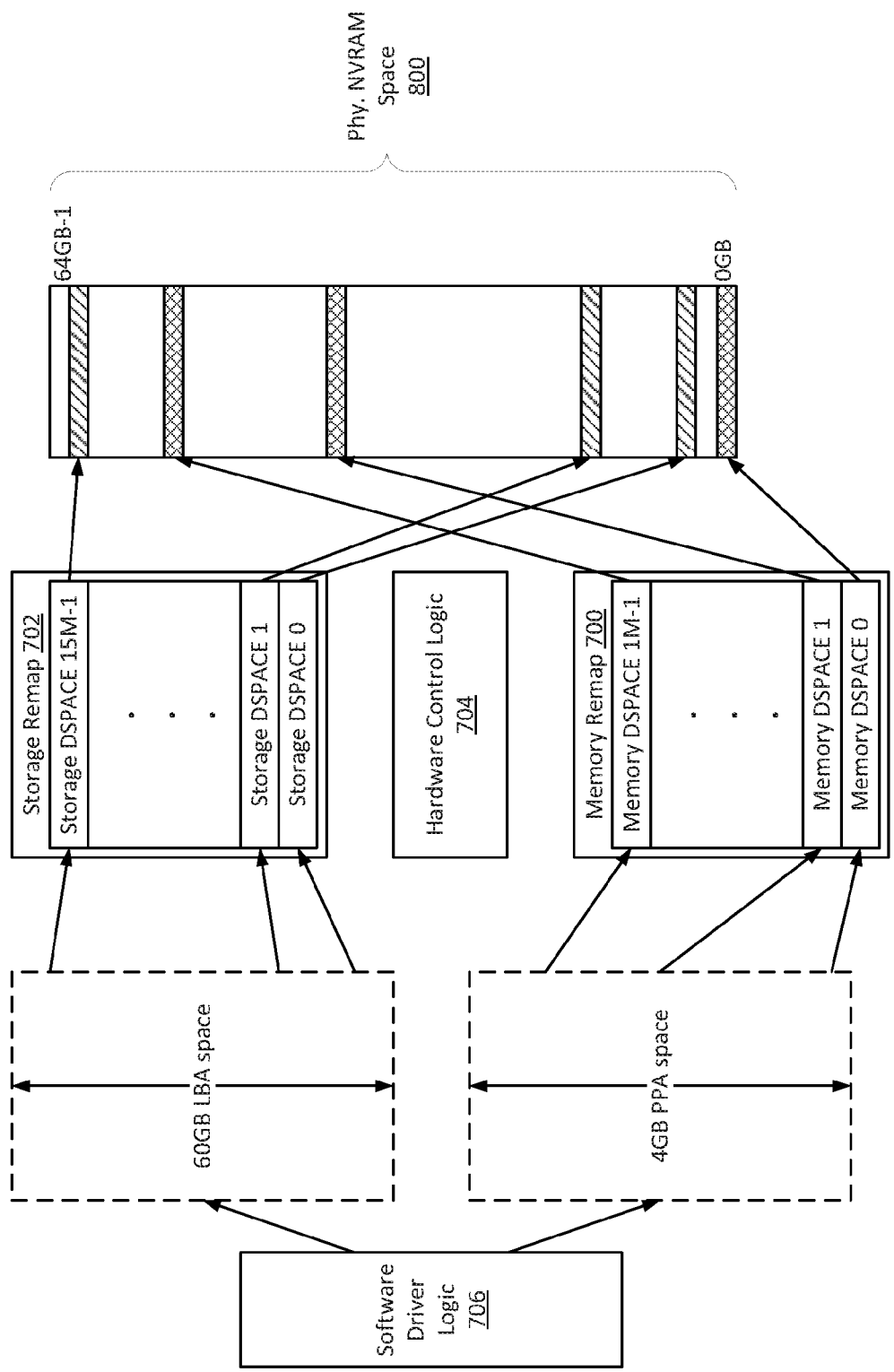
FIG. 8 illustrates an embodiment of address redirection tables to map platform physical addresses and logical block addresses into non-volatile random access memory with no pre-designated physically linear portion of non-volatile random access memory for storage use memory use.

FIG. 8 illustrates the same address redirection tables as FIG. 7 to map PPAs and LBAs into NVRAM, but instead of having a pre-designated physically linear portion of NVRAM for storage use and another portion for memory use, each physical location in the NVRAM in FIG. 8 is allowed to be designated for either storage or memory use. Thus, in FIG. 8, each location in the entire physical NVRAM space 800 is capable of being utilized for memory or storage.

Figure 9:
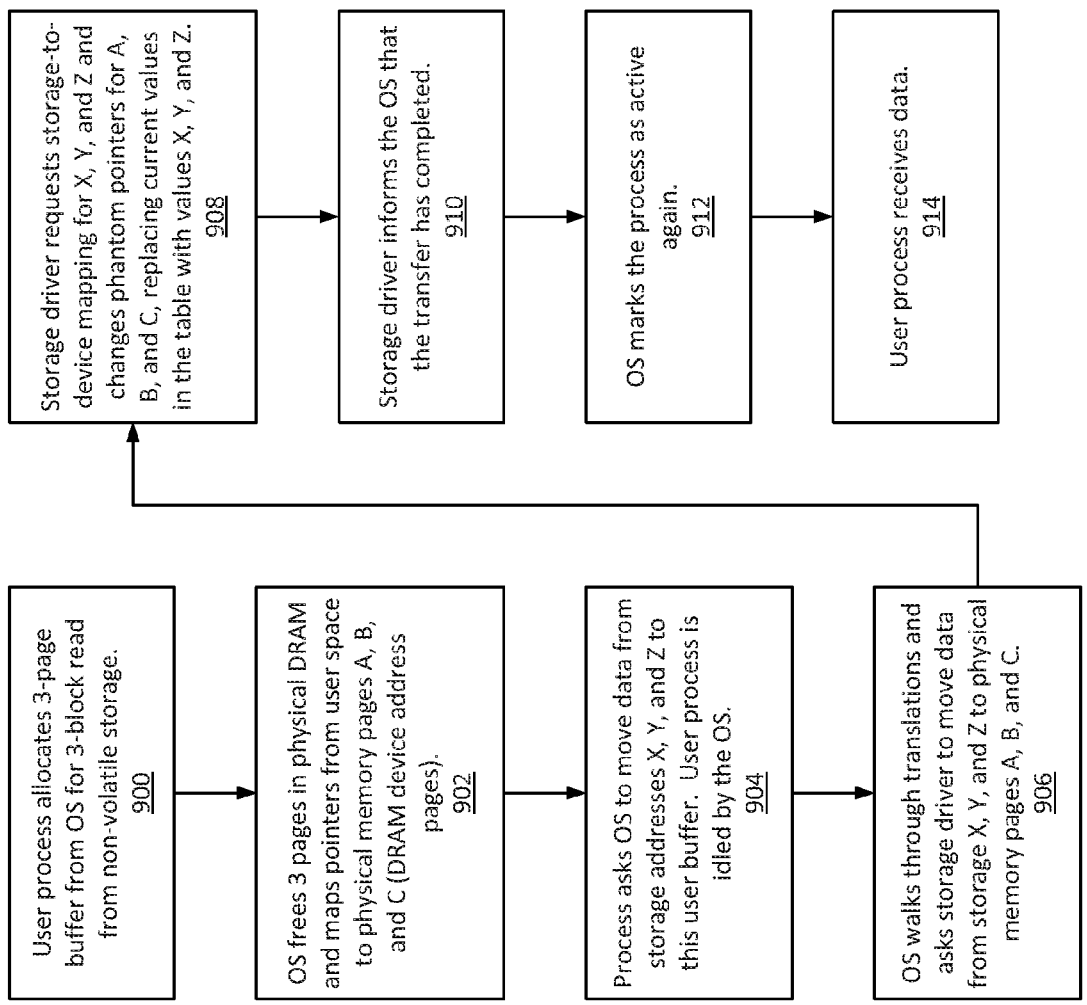
FIG. 9 is a flow diagram of an embodiment of a process to allow non-volatile storage pages that reside in a particular type of device to be mapped directly into a software application's address space.

FIG. 9 is a flow diagram for a process to allow non-volatile storage pages that reside in a particular type of device (e.g., PCMS memory) to be mapped directly into a software application's address space. This process is able to complete without copying the data from the storage media (where the data is stored long term) to the memory where the data is utilized by the running software application. By eliminating this copy, which in a standard implementation would otherwise involve at least a CPU interrupt and a direct memory access (DMA) transfer, significant time is saved and less power is consumed from the point when the software application requests the data until the time the software application has access to the data in its address space. The process is performed by processing logic that may be comprised of hardware, software, or firmware logic or may be a combination of multiple types of logic. Additionally, the process described below and in FIG. 9 is simply an illustrative example using a 3-page allocation of memory. In other embodiments, there may be less or more pages to be allocated and the steps involved may vary in one or more different ways to complete the process.

The process begins by processing logic in a user process (e.g., a software application running on an OS) allocating a 3-page buffer from the OS for a 3-block read from non-volatile storage (e.g., PCMS) (processing block 900). In other embodiments, this may be a smaller or larger number of pages in the page buffer and a smaller or larger number of blocks for the read. Next, processing logic in the OS frees 3 pages in physical DRAM and maps pointers from the user space in the OS to physical memory pages A, B, and C (processing block 902). Pages A, B, and C are actual DRAM device physical address pages. Although processing logic at block 902 is described as being in the OS, in other embodiments, this processing logic may be implemented in hardware for faster allocation. Additionally, although the user buffer is described as being in DRAM, in other embodiments, the user buffer may be present in a specialized SRAM or in a dedicated portion of the processor's cache as opposed to simply being present in DRAM.

Then processing logic in the user process requests the OS to move data from non-volatile storage addresses X, Y, and Z (representing the 3 blocks in non-volatile storage) to the user buffer. Additionally, at this time the user process is set into an idle state by the OS (processing block 904). Next, processing logic in the OS walks through all memory translations to get to the physical memory page addresses and requests a storage driver running on the OS to move the data from storage addresses X, Y, and Z to physical memory pages A, B, and C. (processing block 906). Again, the processing logic in blocks 904 and 906 may be in hardware, rather than in the OS, in other embodiments. Furthermore, in other embodiments, hardware logic may be used in place of the storage driver to move data from storage address to physical memory pages.

Then processing logic in the storage driver requests a storage/device mapping for LBA storage addresses X, Y, and Z and changes pointers to memory pages A, B, and C to those for X, Y, and Z (processing block 908). The storage driver then informs the OS that the transfer has been completed (processing block 910), the OS marks the user process as active again (processing block 912), and the user process then receives the data (processing block 914). In other embodiments that are not shown, there is a single table mapping memory and storage to physical NVRAM pages where an entry for each page in the single table has a bit field that indicates whether the page is being utilized for storage or memory. In this embodiment, remapping from storage to memory, or vice versa, simply involves flipping the bit to designate the page in the other format.

Accesses to the storage space are directly mapped into the memory space in the following way:

All accesses are processed through the memory remapping table (700 in FIG. 8). For example, any time an application produces a read access to address 1 MB, the remapping mechanism will access the 256th entry in its table (assuming 4 KB pages) and redirect the read to a memory-owned page in the PCMS space, according to the address held in the 256th entry of the table.

When the operating system asks the SATA or other device driver to copy a page from, for example, the 100 GB area on the "disk" into the 1 MB area in the phantom memory, the device driver will send that information to the hardware interface mechanism to remap pointers.

In this specific case the hardware mechanism will receive a message to copy the page at 100 GB in storage into the phantom DRAM page at 1 GB. Instead of physically moving the data, the 256th pointer in the phantom remapping table will be overwritten by 100 GB/4 KB, thus causing all future read accesses to phantom 1 MB to be serviced from the 100 GB location formerly mapped as storage.

Essentially, what was previously a designated storage location in physical NVRAM space (800 in FIG. 8), may be changed to a memory location, or vice versa. And the process for doing this simply involves switching pointers within the memory and storage remap tables (700 and 702, respectively, in FIG. 8).

Although many forms of NVRAM may be utilized for these implementations, PCMS is a good candidate due to low read latencies. But PCMS has a substantial asymmetry between its read and write latencies. Thus, when dealing with PCMS, there are certain processes that may be utilized to minimize the shortcomings of PCMS writes. As a result of the much slower write times, there can be substantial delay added to read latencies when an ongoing write is occupying the PCMS memory system.

According to some embodiments, writes are performed only to pages that have been pre-cleaned (actually pre-set), since writing data to a pre-cleaned page is substantially faster than writing to a page that hasn't been prepared. Unfortunately, having a policy that writes only to pre-cleaned pages is not energy-efficient because this roughly doubles the energy taken to write each bit.

In many embodiments, a mechanism is utilized to write to pre-cleaned pages when the PCMS memory system is relatively busy and writes to non-cleaned pages when the PCMS memory system is relatively quiet. The net effect is to provide minimum power consumption while the system is lightly loaded and to trade higher power for improved performance when the system becomes busy.

Figure 10:
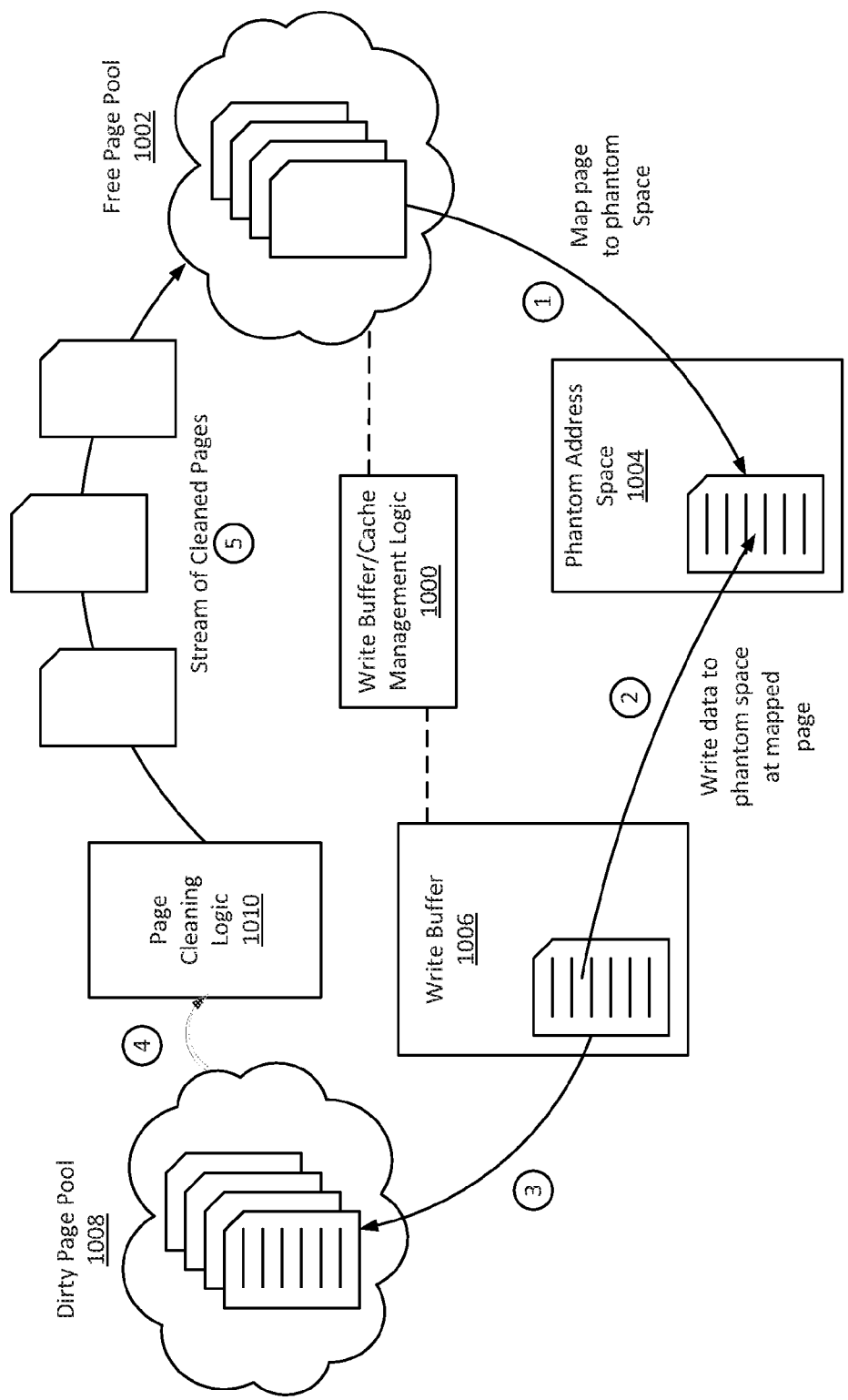
FIG. 10 illustrates an embodiment of a PCMS page cleaning process using a page empty write policy.

FIG. 10 illustrates an embodiment of a PCMS page cleaning process using a page empty write policy. As stated, because of the nature of PCMS storage, it can take several times longer to write data to PCMS than it does to read data from PCMS. This asymmetry complicates the process of designing a memory and/or storage controller, since write operations can block access to an area of the PCMS for a substantial length of time and prevent a performance-sensitive read from being serviced.

There are also significant write time deviations between setting a PCMS storage element (a bit) to "1," which takes a relatively long time, versus setting the same element to "0," which takes roughly the same amount of time as it takes to read an element. Thus, it is highly beneficial to preset free pages of PCMS memory to all 1's, and then, while performing a write to the page with information, only the bits that need to be set to 0 would need to be changed.

Therefore, in many embodiments, a pool of preset pages (pages in which every bit is set to 1) is utilized for write operations. The PCMS storage/memory controller is responsible for scheduling transfers of read and write data between any controller caches or write buffers that are used to store data in motion to and from the PCMS devices. Optimally, all data that won't be accessed for a while would be moved into PCMS in order to make room in controller caches and write buffers for other data. Additionally, moving data that will be used soon into controller caches will increase system performance.

According to many embodiments, the process shown in FIG. 10 may help the PCMS storage/memory controller to reduce the time that the controller's caches and write buffers are unavailable for useful work because they are waiting for data to be retired (i.e., written to) PCMS devices. Turning to FIG. 10, in many embodiments write buffer/cache management logic 1000 resides within a controller (not shown). This controller may be the memory controller, the storage controller, a combined memory/storage controller, or another controller altogether in different embodiments. The write buffer/cache management logic 1000 essentially is management logic that manages one or more write buffers and/or one or more caches that are resources of the controller for PCMS operations. For example, a write buffer in this sense may be a storage location where pending writes to one or more PCMS devices are queued while they wait to be retired (i.e., completed). The pending writes in the write buffer wait for a free page of PCMS memory to become available and then the management logic coordinates the write from the buffer to the free page.

More specifically, a free page pool 1002 of free PCMS memory pages is accessible to the write buffer/cache management logic 1000. When the management logic decides to go ahead and retire a write request, a page from the free page pool 1002 is mapped into phantom address space 1004 (step 1—denoted by the 1 in the circle in FIG. 10). Then write buffer/cache management logic 1000 executes the write request from the write buffer 1006 by writing data to the phantom address space 1004 at the mapped page (step 2). The write buffer entry is then marked available and the page that is no longer needed is sent to a dirty page pool 1008 (step 3). The dirty page pool may simply be a dirty list of PCMS pages that have data which is no longer needed. In many embodiments, the dirty page pool 1008 is a list of pages pointed to by a dirty page pool pointer. For each page taken from the list, the pointer then points to the next page on the list. Each new dirty page, such as the dirty page sent to the dirty page pool 1008 from step 3, may be appended to the end of the list.

Page cleaning logic 1010 then pulls a page from the dirty pool and cleans it (step 4). In many embodiments, the cleaning process sets all bits in the page to "1" to pre-set the page for fast writes. A stream of pages (step 5) is then sent by the page cleaning logic 1010 to the free page pool 1002. Similarly to the dirty page pool 1008, the free page pool 1002 may be pointed to by a free page pool pointer. The free page pool pointer points to the page at the front of a list of free pages of PCMS memory. When a page is taken from the list and mapped to phantom address space for a write, the pointer then points to the next page in the list. When a clean page arrives from the stream of clean pages, that page is appended to the end of the list.

The page cleaning logic 1010 generally operates independently from the write buffer/cache management logic 1000. The page cleaning process, per page, is governed at a rate that takes into consideration overriding system considerations, such as power and performance operating points. In many embodiments, the page cleaning logic 1010 keeps a count of pages that need cleaning, by incrementing a counter for every page that arrives at the dirty page pool 1008 and decrementing the same counter for every page that is pulled out of the dirty page pool 1008 to be cleaned. This is in addition to keeping track of the pointer to the front of the list of pages that comprises the dirty page pool 1008. In other embodiments, the dirty page pool 1008 and clean page pool 1002 may be kept in tables rather than in lists.

According to some embodiments, write buffer/cache management logic 1000 may include logic that fills gaps for partially cached pages. For example, if the write buffer has partial data from a page to write to a clean page mapped into phantom address space, then the logic can perform a read from the PCMS device to get the remaining information for the page to fill in the gaps of write data.

Figure 11:
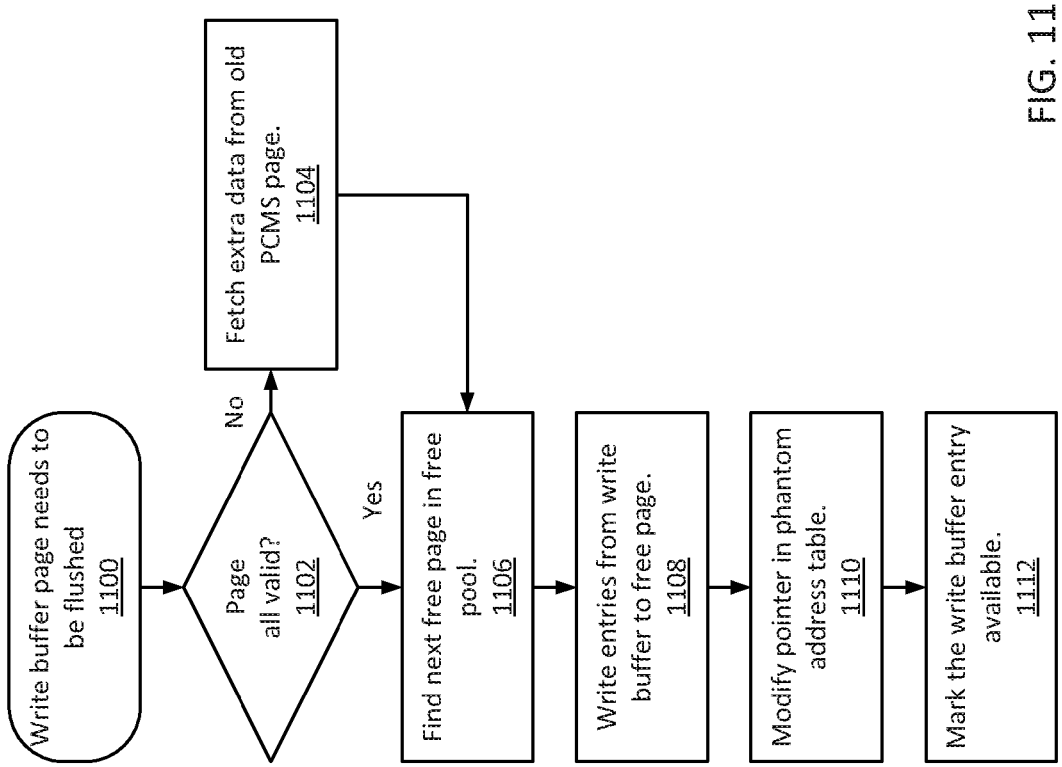
FIG. 11 illustrates an embodiment of a process flow for the write mechanism that writes data to PCMS pages available in phantom address space.

Additionally, the write buffer/cache management logic 1000 includes a mechanism that is capable of physically writing data from the write buffer 1006 to a physical PCMS page of memory. With the page cleaning logic 1010 in operation, there could always be some number of pre-set pages available for writes. FIG. 11 illustrates an embodiment of a process flow for the write mechanism that writes data to PCMS pages available in phantom address space. The process is performed by processing logic, which may comprise hardware, software, firmware, or a combination of two or more of these listed forms of processing logic.

The process begins with a page of data in a write buffer that needs to be flushed (processing block 1100). The page is waiting to be written out to a PCMS memory device and the process of flushing the buffer accomplishes the write. The process continues with processing logic determining if the entire page of data is valid (processing block 1102). If the entire 4K page of data is not valid then processing logic fetches data for the portions of the page that are not valid from the old PCMS page that had the data which went into the write buffer (processing block 1104). Then regardless of whether processing block 1104 is performed, the next step for either logic flow path is for processing logic to find the next free PCMS page in the free page pool (processing block 1106).

Once the free page is located, in some embodiments, processing logic writes the entry or entries from the write buffer to the found free page in the free pool (processing block 1108). In some embodiments, processing logic then modifies the pointer in the phantom address table (which also can be referred to as the memory remap table 700 from FIG. 7) to point to the page that was just written to (processing block 1110). Then processing logic marks the write buffer entry available (processing block 1112) to allow another write request to enter the write buffer.

Figure 12:
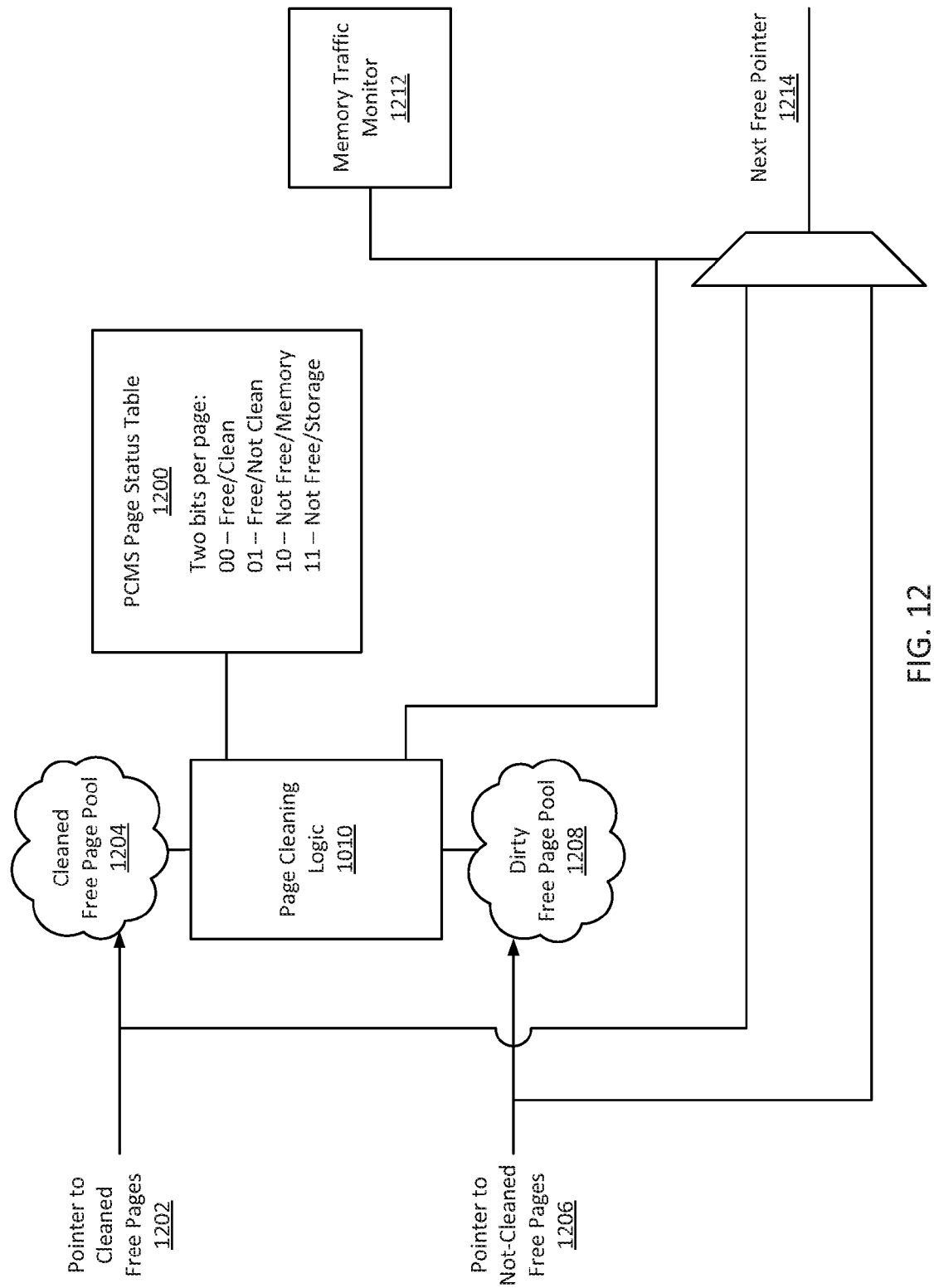
FIG. 12 illustrates an embodiment of a mechanism to allow PCMS pages to be written to efficiently from a power/performance perspective.

FIG. 12 illustrates an embodiment of a mechanism to allow PCMS pages to be written to efficiently from a power/performance perspective. According to many embodiments, a PCMS page status table 1200 is stored in the computer system. The location of the PCMS page status table 1200 differs in different embodiments. In many embodiments, the PCMS page status table 1200 is stored in the PCMS itself because the table can be substantially large (e.g., 1 TB of PCMS of 4 KB page granularity is 1 TB/4 KB=256 million entries). In other embodiments, this table may be stored in a reserved section of DRAM if there is enough reserved space available.

The PCMS page status table 1200 includes two bits per page entry that is encoded as follows:
- 00—page is not in use and clean
- 00—page is not in use, but requires cleaning
- 10—page is in use as far memory
- 11—page is either allocated to storage or is bad At 2-bits per entry with 256 million entries for a TB of PCMS, the table would require 64 MB of storage. This page status table allows for a distinction between pages that have been pre-cleaned (e.g., pages that have all bits with "1") and pages that haven't been cleaned (e.g., pages that have old data in them and also known as "dirty" pages).

For access to free pages, two pointers are provided. A first pointer 1202 points to a list (i.e., pool) of cleaned free pages 1204. A second pointer 1206 points to the list/pool of dirty free pages 1208. In many embodiments, these pools comprise a list of addresses to the locations in PCMS physical address space. In some embodiments, these two pools may be maintained in adjacent locations to the PCMS page status table 1200. In other embodiments, these two pools may be maintained elsewhere in the system, such as in DRAM.

Page cleaning logic 1010 (which is potentially located within memory/storage control in FIG. 7 and FIG. 8, but could be located elsewhere) cleans pages of PCMS memory and either finds or is provided a list of free pages that are dirty (old data is located on these pages, which means the bits on these pages are not all set to "1"). The PCMS page status table 1200 maintains the status of each page and the page cleaning logic 1010 can maintain the status of each page. For example, when a dirty free page is pulled out of the dirty free page pool 1208 and cleaned, page cleaning logic 1010 may update the PCMS page status table 1200 entry for that particular page from 01 "free/not clean" to 00 "free/clean."

In other embodiments, page cleaning logic 1010 can additionally search the PCMS page status table 1200 for free/not clean pages (01) to be cleaned. For found pages that are not clean, page cleaning logic 1010 can add the page to the dirty free page pool 1208.

During times when there is little or no PCMS traffic, page cleaning logic 1010 may decide to clean one or more pages located in the dirty free page pool 1208. When this happens to a page, page cleaning logic then adjusts the status bits for that page in the PCMS page status table 1200 to 00, which signifies the page is free and clean. Then page cleaning logic 1010 may move that page from the dirty free page pool 1208 to the cleaned free page pool 1204. When there is significant PCMS traffic, page-cleaning logic may not attempt to clean any pages to not adversely impact PCMS memory performance.

To determine when there is PCMS traffic, a memory traffic monitor 1212 is utilized to track recently consumed PCMS bandwidth. During operation, the memory traffic monitor logic is constantly counting the number of memory transactions within a given period of time, such as 1 microsecond (μs). If the number of PCMS transactions during this given period is greater than a programmable value (the programmable value may be programmed through BIOS or elsewhere), then a bit is set in a shift register located within memory traffic monitor 1212. A separate piece of logic in the memory traffic monitor 1212 monitors the shift register in order to understand how many "busy" periods of time the system has had during the past "n" periods of time. If the number of busy periods is greater than a programmable number, then the logic will cause the next free pointer 1214 to be sourced from the cleaned free page pool 1204. If the number of busy periods is less than or equal to the value, then the next free pointer 1214 will be sourced from the not-cleaned free page pool 1208.

As mentioned above, this same memory traffic monitoring logic may be utilized to help page cleaning logic 1210 determine when to clean pages, thus, the memory traffic monitor 1212 is additionally communicatively coupled to the page cleaning logic 1210 in many embodiments.

In another embodiment, the system could choose to pre-clear pages in all cases where the device was connected to alternating current (AC) power, since the power consumption may only be a problem when a device is running on battery.

Returning to FIG. 7, it is generally the case that "memory" is more commonly read from and written to than "storage" during standard operations. Thus, if the portion of NVRAM (e.g., PCMS) that is designated as memory space stays that way and the remaining portion of NVRAM is designated as storage space, then, due to general wear characteristics for many types of non-volatile memories, the memory space and storage space sections will wear unevenly over time.

Figure 13:
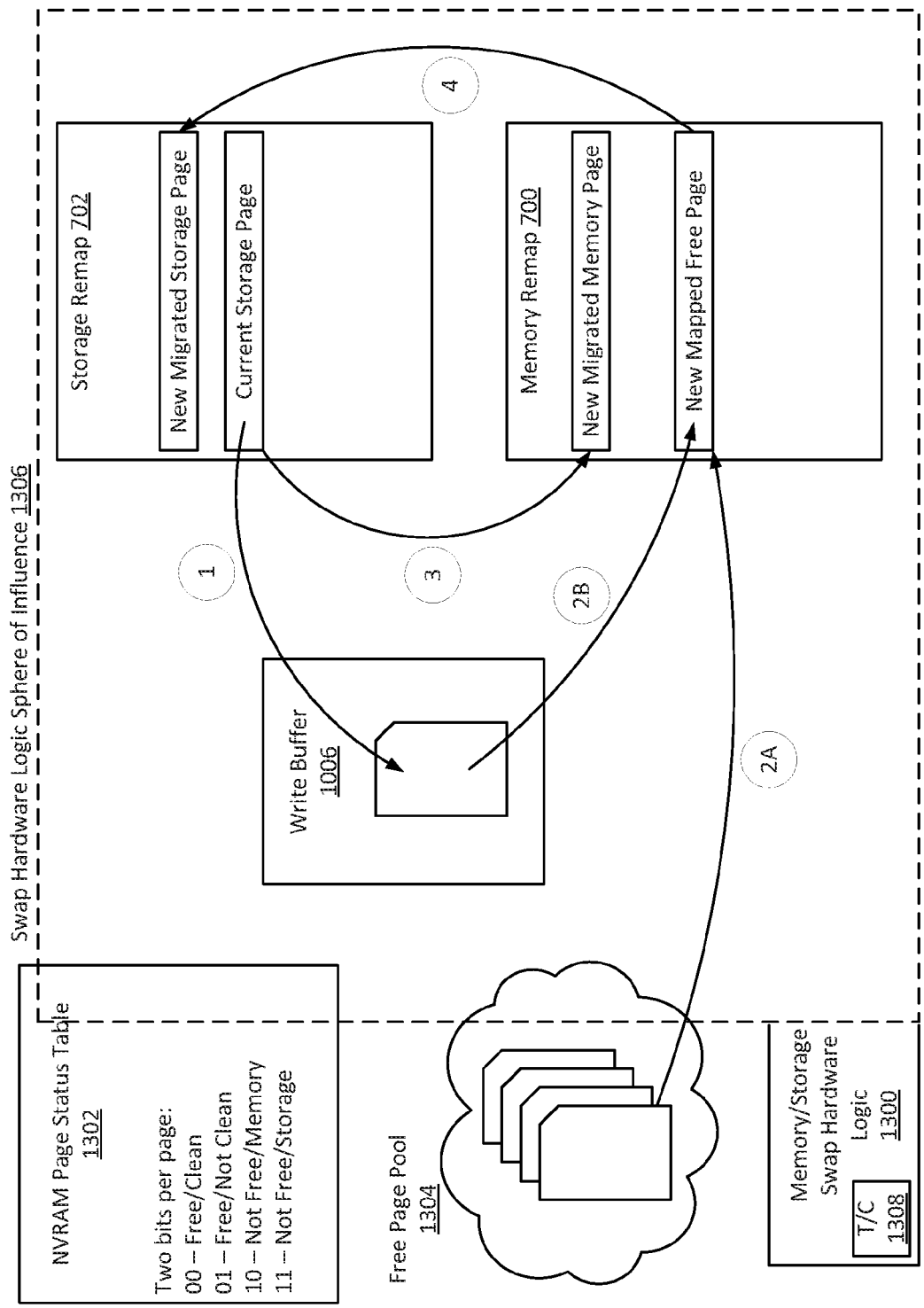
FIG. 13 illustrates an embodiment of a mechanism to allow the consistent movement of non-volatile random access memory pages between memory and storage designations.

Thus, to remedy this issue, FIG. 13 illustrates an embodiment of a mechanism to allow the consistent movement of NVRAM pages between memory and storage designations.

In FIG. 13, there is a NVRAM memory/storage swap hardware logic 1300 that migrates NVRAM pages between memory use and storage use. The memory/storage swap hardware logic 1300 utilizes:
- A bit-mapped non-volatile table that reflects the status of each page of NVRAM (i.e., whether the page is assigned to storage or if it's available for memory). This table generally would be stored within the NVRAM itself. For example, for a PCMS-based system, this table may comprise NVRAM page status table 1302 (similar or the same as PCMS page status table 1200 in FIG. 12).
- The storage remapping table 702 that maps storage-space LBA addresses to NVRAM device addresses.
- A hardware mechanism to cause NVRAM storage pages to move to an available memory-space page and allow the storage-space page that previously contained the data to be re-purposed for memory use.

In many embodiments, when the logic illustrated in FIG. 13 operates, the following attributes are taken into consideration:

The memory pool write mechanism will always write data to an empty memory-allocated page.

The storage pool, represented by NVRAM addresses that are mapped into storage remapping table 702, interacts with the memory write mechanism to write to storage-allocated pages, migrating the written page to the storage pool when the write completes.

The storage pool pushes pages that are no longer necessary into the write pool when it notices they are no longer needed. In some embodiments, they are pushed into the free page pool 1304, which may or may not be a "clean" pool (i.e. a pool of free pages that have been pre-set for writes, such as the one discussed above in regard to FIG. 12.

When a page is written to storage, these attributes for this process will cause the written page to migrate from the memory pool to the storage pool and the page previously allocated to the storage location to migrate from the storage pool to the memory pool.

FIG. 13 describes the hardware mechanism, which in the illustrated embodiment is shown as memory/storage swap hardware logic 1300. This logic may be located within memory/storage control logic or elsewhere in the system. To provide an illustrative example, the memory storage swap hardware logic 1300 presides over a sphere of influence in the memory/storage subsystem 1306. The sphere of influence 1306 simply shows at least a minimal amount of hardware and software logic that the memory/storage swap hardware logic 1300 can control to perform one of these swaps.

The process is started through a periodic timer or write counter (timer/counter: T/C 1308) that may be present within the memory/storage swap hardware logic 1300. At a certain point, the T/C 1308 fires (which refers to a specified amount of time passing for the counter or a specified number of writes taking place) and causes the data in a PCMS device page allocated to a storage (a current storage page mapped into storage remap table 702) to be copied to write buffer 1006 (step 1). Once the write buffer 1006 has the data to be written to an empty page in NVRAM memory space (a page allocated to memory remap table 700), then a free page from the free page pool 1304 is allocated and mapped into the memory remap table 700 (step 2A).

Once the page is allocated in the table, then the write buffer is flushed and the data originally received from the current storage page is written into the new mapped free page in memory remap table 700 (step 2B). At this point, the data that was stored in the current storage page in storage space is now located in the new mapped free page in memory space. After this takes place, or potentially in conjunction with steps 2A and 2B, the NVRAM address to the current storage page (which now has old data in it) is reallocated into memory space as the new migrated memory page (step 3). Thus, the physical NVRAM page that this address points to changes from being allocated as storage space in the storage remap table 702 to being allocated as memory space in the memory remap table 700. At the same time of this reallocation or at a later time, the new mapped free page, which now has the storage data written to it that arrived from the write buffer 1006 in step 2B, is reallocated as a new migrated storage page (step 4). Therefore, the physical NVRAM page that this address changes from being allocated as memory space in the memory remap table 700 to being allocated as storage space in the storage remap table 702.

At this point the migration has completed. This migration can methodically happen for page after page of physical NVRAM memory. Whenever the T/C 1308 fires, another memory allocated page is migrated to storage and a corresponding storage allocated page is migrated to memory. When this process is repeated throughout all NVRAM physical pages over time, the result is an evenly worn NVRAM device from the bottom to top of the device's physical memory addresses.

Additional power and performance considerations may be necessary for efficiency purposes depending on the "plane" configuration of an NVRAM physical device. For example, with PCMS in many cases there are multiple "planes," which refer to regions of memory that are efficient when working with consecutive accesses in a given plane, but the device loses transaction efficiency (from both a power and performance perspective) when consecutive accesses to different physical memory locations cross planes.

PCMS generally has fairly short latencies for most accesses, about 50 nanoseconds (ns) for current generation devices, but requires longer latencies, about 100 ns when successive accesses are to two different planes in the memory device, where a plane may represent about a quarter of the entire memory space in the device. Additionally, there can be substantial power/energy penalties for crossing planes between accesses.

Figure 14:
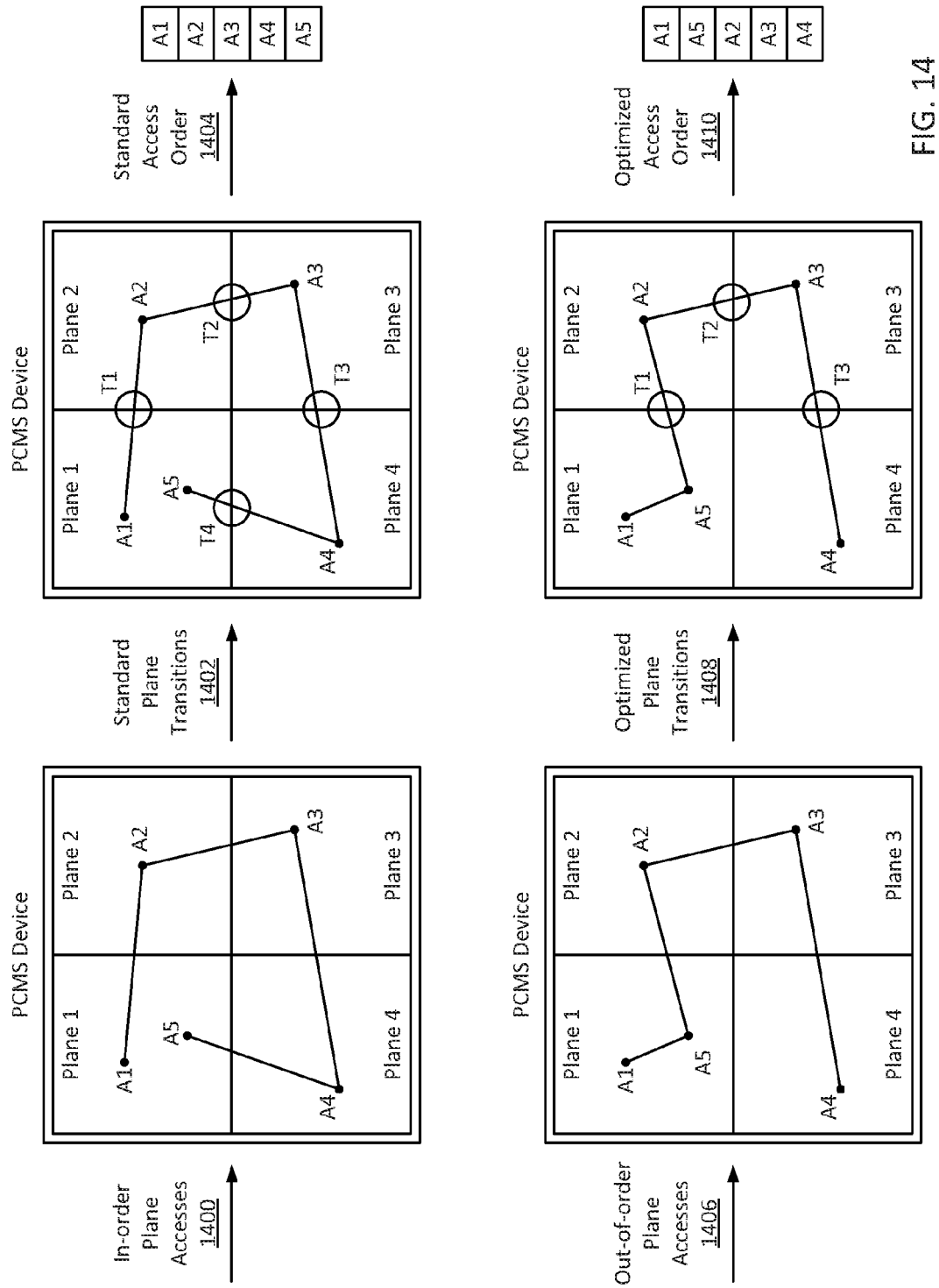
FIG. 14 illustrates an embodiment of a process and an accompanying mechanism (i.e. hardware logic) to support the process of eliminating unnecessary PCMS plane transitions.

Thus, a mechanism is suggested to alleviate these penalties as much as possible by eliminating as many unnecessary plane transitions as possible. FIG. 14 illustrates an embodiment of such a process and an accompanying mechanism (i.e. hardware logic) to support the process of eliminating unnecessary PCMS plane transitions.

In many embodiments, there is a set of PCMS device accesses (A1 through A5) that are shown in order on the actual planes in view 1400. Access 1 is to a physical location in plane 1, access 2 is in a physical location in plane 2, access 3 is in a physical location in plane 3, access 4 is in a physical location in plane 4, and access 5 is in a physical location in plane 1. In view 1402, the transitions (T1 through T4) between planes are shown when the accesses are retired in order. Specifically, plane transition 1 takes place between accesses 1 and 2, plane transition 2 takes place between accesses 2 and 3, plane transition 3 takes place between accesses 3 and 4, and plane transition 4 takes place between accesses 4 and 5. So with a standard access order view 1404 of accesses in the order received, there are 4 plane transitions.

With a memory control logic having transaction buffers that are queued (incoming read and write requests are queued prior to execution, it is possible and actually desirable to re-order the transaction order when logic has knowledge of the physical locations of the accesses. Thus, memory control logic, which may include a PCMS transaction re-order logic unit, has the capability of performing lookups from queued PCMS transactions by using memory/storage remapping logic (discussed above) to obtain physical PCMS addresses for each transaction. Based on having knowledge of the physical location of each PCMS transaction in a transaction queue, a PCMS transaction re-order logic unit may perform a re-order of transactions to increase the plane transition efficiency of a set of transactions.

For FIG. 14, a reasonable set of out-of-order plane accesses 1406 (modified from the in-order plane accesses shown in view 1400) will move the fifth access (A5) from the fifth position in the transaction queue to the second position. Thus, the newly re-ordered set of accesses would be A1 in plane 1, then A5 in plane 1, then A2 in plane 2, then A3 in plane 3, and finally A4 in plane 4. This order would change the number of plane transitions from four to three, as shown in view 1408, which shows plane transition 1 happening between accesses 5 and 2, plane transition 2 happening between accesses 2 and 3, and plane transition 3 happening between accesses 3 and 4. The result is an optimized access order 1410 with one less plane transitions. This reordering would decrease overall power consumption as well as increase the memory throughput due to less latency-intense plane transitions.

4. SoC-Based Computing Device Overview

Figure 15:
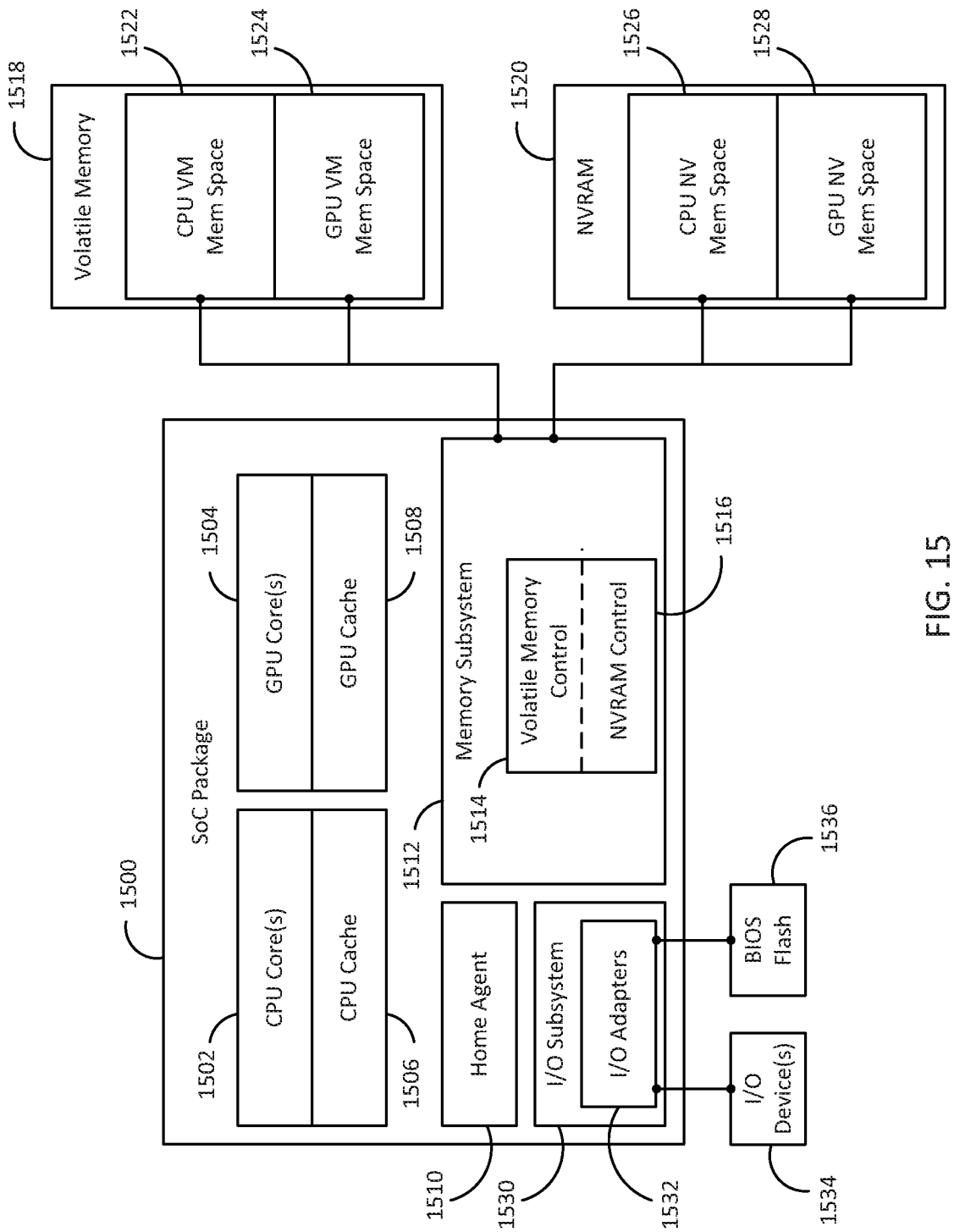
FIG. 15 illustrates an embodiment of a computing device incorporating the multi-level memory with direct access-based memory subsystem.

FIG. 15 illustrates an embodiment of a computing device incorporating the MLMD-based memory subsystem as being a system-on-a-chip (SoC) package 1500 design, which combines processor, graphics, memory, and I/O control logic into one SoC package. Thus, in FIG. 15, CPU core(s) 1502, the GPU core(s) 1504, their respective caches (1506 and 1508) are all present in the package, along with memory subsystem 1512 and I/O subsystem 1530.

Although not shown, each CPU core may internally include one or more instruction/data caches, execution units, prefetch buffers, instruction queues, branch address calculation units, instruction decoders, floating point units, retirement units, etc. Each core present is located on a CPU semiconductor die. For each logic unit shown other than the core(s) 1502 in the SoC Package 1500, the logic unit may be on the CPU core(s) 1502 semiconductor die in some embodiments or on another die in other embodiments. If a given logic unit is not on the same die as CPU core(s) 1502, that logic unit would be on a different semiconductor die, though in the same SoC package 1500, which can include several dies communicatively coupled with each other in the package.

The SoC 1500 also includes at least one lower level CPU cache, such as CPU cache 1506. This may be a general purpose cache that is capable of storing a significant amount of data retrieved from memory locations in volatile memory 1518 and/or NVRAM 1520. In different embodiments, CPU cache 1506 may be shared among all cores or each core may have its own lower level cache.

One or more GPU core(s) 1504 are also included in SoC package 1500 as well as a lower level GPU cache 1508 which may store graphics related data for the GPU Core(s) 1504 to work on. GPU core(s) 1504 may internally include one or more execution units and one or more instruction and data caches utilized to feed the execution units with information to process. Additionally the GPU core(s) 1504 may contain other graphics logic units that are not shown in FIG. 15, such as one or more vertex processing units, rasterization units, media processing units, and codecs among others. For sake of simplicity, the specific logic within the GPU core(s) 1504 is not shown.

SoC package 1500 may also include a home agent 150 that incorporates components coordinating and operating core(s) 1502 as well as other elements of SoC package 1500. Home agent unit 1510 may include, for example, a power control unit (PCU). The PCU may include logic and components needed for regulating the power state of the core(s) among other tasks.

In FIG. 15, the SoC package 1500 also includes a memory subsystem 1512 that has an integrated volatile memory controller 1514, which may be utilized to provide access to volatile memory 1518. Volatile memory control 1514 may receive a memory access request from a CPU core and route that request to volatile memory 1518. Likewise, NVRAM control 1516 may receive a memory access request from a CPU core and route that request to NVRAM 1520.

"Volatile memory" 1518 is an intermediate level of memory configured in conjunction with NVRAM 1520 that has lower read/write access latency relative to NVRAM 1520 and/or more symmetric read/write access latency (i.e., having read times which are roughly equivalent to write times). As discussed above, in some embodiments, the volatile memory 1518 has significantly lower write latency than the NVRAM 1520 but similar (e.g., slightly lower or equal) read latency; for instance the volatile memory 1518 may be a volatile memory such as volatile random access memory (VRAM) and may comprise a DRAM or other high speed capacitor-based memory. Note, however, that the underlying principles of the invention are not limited to these specific memory types. Additionally, the volatile memory 1518 may have a relatively lower density and/or may be more expensive to manufacture than the NVRAM 1520.

In some embodiments, volatile memory 1518 is configured between the NVRAM 1518 and the CPU cache 1506. In some of the embodiments described below, volatile memory 1518 is utilized to mask the performance and/or usage limitations of the NVRAM 1520 including, for example, read/write latency limitations and memory degradation limitations. In these implementations, the combination of volatile memory 1518 and NVRAM 1520 operates at a performance level which approximates, is equivalent or exceeds a system which uses only DRAM as system memory.

Although shown in a specific configuration in FIG. 15, in different embodiments, volatile memory 1518 can be located on the processor die, located external to the processor die on a separate die located on the SoC package 1500, located outside the CPU package with a high bandwidth link to the SoC package 1500, for example, on a memory dual in-line memory module (DIMM), a riser/mezzanine, or a computer motherboard). In FIG. 15, volatile memory 1518 is shown being located external to the SoC package 1500. The volatile memory 1518 may be communicatively coupled with the SoC package 1500 using a single or multiple high bandwidth links, such as DDR or other transactional high bandwidth links. A communicative coupling of devices refers to being coupled through an electrical, optical, wireless, or other form of link or combination of links to allow information to be passed back and forth between the devices that are coupled to one another. In some embodiments, the coupling is direct and allows information to pass directly from the first device to the second and, potentially, vice versa. In other embodiments, the coupling is indirect and requires the information to pass through one or more additional devices that reside along the route the information takes while being transferred between the two communicatively coupled devices in question.

In many embodiments, an input/output (I/O) subsystem 1530 is present in the system in FIG. 15 to communicate with I/O devices, such as I/O device(s) 1534. The I/O subsystem 1530 in FIG. 15 is integrated into the SoC package 1500. Within the I/O subsystem 1530, one or more I/O adapter(s) 1532 are present to translate a host communication protocol utilized within the CPU core(s) 1502 to a protocol compatible with particular I/O devices. Some of the protocols that adapters may be utilized for translation include Peripheral Component Interconnect (PCI)-Express (PCI-E), 3.0; Universal Serial Bus (USB), 3.0; Serial Advanced Technology Attachment (SATA), 3.0; Small Computer System Interface (SCSI), Ultra-640; and Institute of Electrical and Electronics Engineers (IEEE) 1594 "Firewire;" among others.

Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols A Basic Input/Output System (BIOS) flash 1536 device may additionally be present in the system to provide a set of boot instructions when the system powers on or reboots. For BIOS flash 1536 device, some of the protocols that I/O adapters 1534 may translate include Serial Peripheral Interface (SPI), Microwire, among others.

In the following description, numerous specific details such as logic implementations, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Embodiments of the invention may also be provided as a computer program product which may include a non-transitory machine-readable medium having stored thereon instructions which may be used to program a computer (or other electronic device) to perform a process. The non-transitory machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing electronic instructions. Embodiments of the invention may also be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

We claim:

1. A method, comprising:
   designating a first amount of a non-volatile random access memory (NVRAM) for use as memory for a computing system;
   designating a second amount of the NVRAM for use as storage for the computing system;
   generating a memory remap table based on the first amount of the NVRAM designated for use as memory;
   generating a storage remap table based on the second amount of NVRAM designated for use as storage; and
   updating the memory and storage remap tables responsive to a first re-designation of a portion of the first amount of the NVRAM for use as storage or a second re-designation of a portion of the second amount of the NVRAM for use as memory.

2. The method of claim 1, comprising:
   cycling through the entire first amount of NVRAM over a first amount of time to be re-designated from use as memory to use as storage, the cycling including re-designating each of a plurality of portions that make up the entire first amount of NVRAM at separate segments of a plurality of segments of time, the sum of the plurality of segments comprising the first amount of time.

3. The method of claim 1, comprising:
   providing access to at least one physical location in the NVRAM for a software application running on the computer system through the memory remap table, the memory remap table arranged to translate at least a platform physical address to a physical NVRAM address.

4. The method of claim 1, comprising the storage remap table arranged to translate at least a logical block address to a physical NVRAM address.

5. The method of claim 1, comprising:
   generating a page status table having at least a bit associated with separate NVRAM physical pages of the NRAM in separate page status table entries, the separate page status table entries indicating whether a given NVRAM physical page corresponding to a given page status table entry is designated for use as memory or storage.

6. The method of claim 1, comprising:
   determining, for separate NVRAM physical pages of a plurality of NVRAM physical pages, whether individual NVRAM physical pages are free to be written to, an individual NVRAM physical page is free to be written to when the individual NVRAM physical page is not holding valid data; and
   determining, for separately identified free NVRAM physical pages, whether the separately identified free NVRAM physical pages are clean, wherein a given free NVRAM physical page is clean when all stored bits in the given free NVRAM physical page are set to one.

7. The method of claim 6, comprising:
   cleaning at least one separately identified free NVRAM physical page, wherein the at least one separately identified free NVRAM physical page to be cleaned includes at least one stored bit set to zero.

8. The method of claim 7, comprising:
   monitoring an interface to access the NVRAM to determine whether the interface is substantially idle at any given time;
   receiving a write request from a requestor;
   providing at least one of the separately identified free NVRAM physical pages that has not been cleaned when the interface to access the NVRAM is substantially idle; and
   providing at least one of the separately identified free NVRAM physical pages that has been cleaned when the interface to access the NVRAM is not substantially idle.

9. The method of claim 1, wherein the NVRAM comprises at least one of phase change memory, phase change memory and switch (PCMS), resistive memory (RRAM), ferroelectric memory, spin-transfer torque random access memory (STRAM), spin tunneling random access memory (SPRAM), magnetoresistive memory, magnetic memory, magnetic random access memory (MRAM) or semiconductor-oxide-nitride-oxide-semiconductor (SONOS) memory.

10. The method of claim 1, comprising:
designating the first amount of the NVRAM for use as memory includes arranging the first amount of the NVRAM to function as at least a portion of system memory for the computing system; and
designating the second amount of the NVRAM for use as storage includes arranging the first amount of the NVRAM to function as mass storage for the computing system.

11. A device, comprising:
a hardware control logic to:
designate a first amount of a non-volatile random access memory (NVRAM) for use as memory for a computing system;
designate a second amount of the NVRAM for use as storage for the computing system;
generate a memory remap table based on the first amount of the NVRAIVI designated for use as memory;
generate a storage remap table based on the second amount of the NVRAM designated for use as storage; and
update the memory and storage remap tables responsive to a first re-designation of a portion of the first amount of the NVRAIVI for use as storage or a second re-designation of a portion of the second amount of the NVRAIVI for use as memory.

12. The device of claim 11, comprising the hardware control logic to:
provide access to at least one physical location in the NVRAIVI for a software application running on the computer system through the memory remap table, the memory remap table arranged to translate at least a platform physical address to a physical NVRAM address.

13. The device of claim 11, comprising the storage remap table arranged to translate at least a logical block address to a physical NVRAM address.

14. The device of claim 11, comprising the hardware control logic to:
generate a page status table having at least a bit associated with separate NVRAM physical pages of the NRAM in separate page status table entries, the separate page status table entries indicating whether a given NVRAM physical page corresponding to a given page status table entry is designated for use as memory or storage.

15. The device of claim 11, comprising:
a write buffer logic to:
determine, for separate NVRAM physical pages of a plurality of NVRAM physical pages, whether individual NVRAM physical pages are free to be written to, an individual NVRAM physical page is free to be written to when the individual NVRAM physical page is not holding valid data;
determine, for separately identified free NVRAM physical pages, whether the separately identified free NVRAM physical pages are clean, wherein a given free NVRAM physical page is clean when all stored bits in the given free NVRAM physical page are set to one; and
clean at least one separately identified free NVRAM physical page, wherein the at least one separately identified free NVRAM physical page to be cleaned includes at least one stored bit set to zero.

16. The device of claim 11, comprising:
the first amount of the NVRAM for use as memory includes arranging the first amount of the NVRAM to function as at least a portion of system memory for the computing system; and
the second amount of the NVRAM for use as storage includes arranging the first amount of the NVRAM to function as mass storage for the computing system.

17. The device of claim 11, wherein the NVRAM comprises at least one of phase change memory, phase change memory and switch (PCMS), resistive memory (RRAM), ferroelectric memory, spin-transfer torque random access memory (STRAM), spin tunneling random access memory (SPRAM), magnetoresistive memory, magnetic memory, magnetic random access memory (MRAM) or semiconductor-oxide-nitride-oxide-semiconductor (SONOS) memory.

18. A system, comprising:
a non-volatile random access memory (NVRAM);
a volatile random access memory; and
a hardware control logic to:
designate a first amount of the NVRAM for use as memory for a computing system;
designate a second amount of the NVRAM for use as storage for the computing system;
generate a memory remap table based on the first amount of the NVRAM designated for use as memory;
generate a storage remap table based on the second amount of the NVRAM designated for use as storage; and
update the memory and storage remap tables responsive to a first re-designation of a portion of the first amount of the NVRAM for use as storage or a second re-designation of a portion of the second amount of the NVRAM for use as memory.

19. The system of claim 18, comprising the hardware control logic to:
provide access to at least one physical location in the NVRAM for a software application running on the computer system through the memory remap table, the memory remap table arranged to translate at least a platform physical address to a physical NVRAM address.

20. The system of claim 18, comprising the hardware control logic to:
cause the memory and storage remap tables to be stored to the volatile random access memory, the volatile random access memory comprising dynamic random access memory (DRAM) or static random access memory (SRAM).

21. The system of claim 18, comprising the storage remap table arranged to translate at least a logical block address to a physical NVRAM address.

22. The system of claim 18, comprising the hardware control logic to:
a page status table having at least a bit associated with separate NVRAM physical pages of the NRAM in separate page status table entries, the separate page status table entries indicating whether a given NVRAM physical page corresponding to a given page status table entry is designated for use as memory or storage; and cause the page status table to be stored to the NVRAM.

23. The system of claim 18, comprising:

a write buffer logic to:

determine, for separate NVRAM physical pages of a plurality of NVRAM physical pages, whether individual NVRAM physical pages are free to be written to, an individual NVRAM physical page is free to be written to when the individual NVRAM physical page is not holding valid data;

determine, for separately identified free NVRAM physical pages, whether the separately identified free NVRAM physical pages are clean, wherein a given free NVRAM physical page is clean when all stored bits in the given free NVRAM physical page are set to one; and clean at least one separately identified free NVRAM physical page, wherein the at least one separately identified free NVRAM physical page to be cleaned includes at least one stored bit set to zero.

24. The system of claim 18, comprising the volatile random access memory arranged to function as a near memory for a multi-level memory and the first amount of the NVRAM designated for use as memory arranged as far memory for the multi-level memory.

25. The system of claim 24, comprising:

the multi-level memory arranged to function as system memory for the computing system; and the second amount of the NVRAM designated for use as storage includes the second amount of the NVRAM arranged to function as mass storage for the computing system.

26. The system of claim 18, wherein the NVRAM comprises at least one of phase change memory, phase change memory and switch (PCMS), resistive memory (RRAM), ferroelectric memory, spin-transfer torque random access memory (STRAM), spin tunneling random access memory (SPRAM), magnetoresistive memory, magnetic memory, magnetic random access memory (MRAM) or semiconductor-oxide-nitride-oxide-semiconductor (SONOS) memory.

* * * * *